US011860202B2

(12) United States Patent
Kagan

(10) Patent No.: US 11,860,202 B2
(45) Date of Patent: Jan. 2, 2024

(54) DEVICES, SYSTEMS AND METHODS FOR METER SETUP VERIFICATION

(71) Applicant: EI ELECTRONICS LLC, Westbury, NY (US)

(72) Inventor: Erran Kagan, Great Neck, NY (US)

(73) Assignee: EI ELECTRONICS LLC, Westbury, NY (US)

(*) Notice: Subject to any disclaimer, the term of this patent is extended or adjusted under 35 U.S.C. 154(b) by 248 days.

(21) Appl. No.: 16/660,673

(22) Filed: Oct. 22, 2019

(65) Prior Publication Data

US 2020/0124649 A1 Apr. 23, 2020

Related U.S. Application Data

(60) Provisional application No. 62/749,585, filed on Oct. 23, 2018.

(51) Int. Cl.
*G01R 21/133* (2006.01)
*G06F 1/3209* (2019.01)
*G01D 4/00* (2006.01)
*G01R 22/06* (2006.01)

(52) U.S. Cl.
CPC .......... *G01R 21/133* (2013.01); *G01D 4/002* (2013.01); *G01R 22/061* (2013.01); *G06F 1/3209* (2013.01)

(58) Field of Classification Search
CPC .................................................. G01R 31/55
See application file for complete search history.

(56) References Cited

U.S. PATENT DOCUMENTS

| 5,514,969 | A | * | 5/1996 | Moore | ................. | G01R 27/16 |
| | | | | | | 324/603 |
| 6,043,642 | A | * | 3/2000 | Martin | ................. | G01R 22/00 |
| | | | | | | 324/103 R |
| 6,751,563 | B2 | | 6/2004 | Spanier et al. | | |
| 7,271,996 | B2 | | 9/2007 | Kagan et al. | | |
| 8,442,660 | B2 | | 5/2013 | Kagan | | |
| 8,717,007 | B2 | | 5/2014 | Banhegyesi | | |
| 2003/0016004 | A1 | * | 1/2003 | Jungwirth | ......... | G01R 19/2513 |
| | | | | | | 324/113 |

(Continued)

OTHER PUBLICATIONS

GE Multilin, EPM 2200 Multi-Function Power Meter Instruction Manual, Software Revision: 1.01 Manual P/N: 1601-9111-A2, Manual Order Code: GEK-113575A, aviable at https://www.ccontrols.com/support/dp/EPM2200.pdf (Year: 2011).*

*Primary Examiner* — Michael J Dalbo
(74) *Attorney, Agent, or Firm* — Robinson + Cole LLP

(57) ABSTRACT

Devices, methods and systems for meter setup verification are provided. In one aspect, a device is provided including a communication interface and at least one processor. The communication interface receives a wiring setup configuration of at least one electronic power meter and at least one measured and/or calculated parameter from the at least one electronic power meter. The at least one processor determines if the at least one electronic power meter is wired correctly based on the wiring setup configuration of the at least one electronic power meter and the at least one measured and/or calculated parameter from the at least one electronic power meter. The device may be implemented in a separate client device or in the at least one electronic power meter.

18 Claims, 17 Drawing Sheets

(56) References Cited

U.S. PATENT DOCUMENTS

| | | | | |
|---|---|---|---|---|
| 2004/0066311 A1* | 4/2004 | Giles | ............... | H04Q 9/02 |
| | | | | 340/870.02 |
| 2005/0194962 A1* | 9/2005 | Briese | ............... | G01R 35/04 |
| | | | | 324/142 |
| 2006/0170409 A1* | 8/2006 | Kagan | ............... | G01R 35/04 |
| | | | | 324/74 |
| 2009/0322314 A1* | 12/2009 | Long | ............... | G01R 21/133 |
| | | | | 324/142 |
| 2011/0161022 A1* | 6/2011 | Caird | ............... | G01R 29/18 |
| | | | | 702/62 |
| 2014/0379156 A1* | 12/2014 | Kamel | ............... | G06Q 10/06 |
| | | | | 700/291 |
| 2015/0070507 A1* | 3/2015 | Kagan | ............... | H04L 63/08 |
| | | | | 348/160 |
| 2016/0131501 A1* | 5/2016 | Steigler | ............... | G06F 16/955 |
| | | | | 340/870.02 |
| 2016/0131688 A1* | 5/2016 | Carlson | ............... | G01R 22/10 |
| | | | | 702/61 |
| 2017/0220404 A1* | 8/2017 | Polar Seminario | ............... | |
| | | | | G06F 11/0736 |
| 2018/0246150 A1* | 8/2018 | Cook | ............... | G01R 15/16 |
| 2019/0004507 A1* | 1/2019 | Daitou | ............... | G06Q 10/20 |
| 2019/0377015 A1* | 12/2019 | Ben Yochanan | ............... | G01R 22/063 |

\* cited by examiner

3 ELEMENT WYE

2 CT DELTA

DEVICES, SYSTEMS AND METHODS FOR METER SETUP VERIFICATION

PRIORITY

This application claims priority to U.S. Provisional Patent Application Ser. No. 62/749,585, filed Oct. 23, 2018, the contents of which are hereby incorporated by reference in its entirety.

BACKGROUND

Field

The present disclosure relates generally to intelligent electronic devices (IEDs) such as electronic power meters, and, in particular, to devices, systems and methods for meter (or IED) setup verification.

Description of the Related Art

Monitoring of electrical energy by consumers and providers of electric power is a fundamental function within any electric power distribution system. Electrical energy may be monitored for purposes of usage, equipment performance and power quality. Electrical parameters that may be monitored include volts, amps, watts, vars, power factor, harmonics, kilowatt hours, kilovar hours and any other power related measurement parameters. Typically, measurement of the voltage and current at a location within the electric power distribution system may be used to determine the electrical parameters for electrical energy flowing through that location.

Devices that perform monitoring of electrical energy may be electromechanical devices, such as, for example, a residential billing meter or may be an intelligent electronic device ("IED"). Intelligent electronic devices typically include some form of a processor. In general, the processor is capable of using the measured voltage and current to derive the measurement parameters, e.g., power consumption. The processor operates based on a software configuration. A typical consumer or supplier of electrical energy may have many intelligent electronic devices installed and operating throughout their operations. IEDs may be positioned along the supplier's distribution path or within a customer's internal distribution system. IEDs include revenue electric watt-hour meters, protection relays, programmable logic controllers, remote terminal units, fault recorders and other devices used to monitor and/or control electrical power distribution and consumption. IEDs are widely available that make use of memory and microprocessors to provide increased versatility and additional functionality. Such functionality includes the ability to communicate with remote computing systems, either via a direct connection, e.g., a modem, a wireless connection or a network. IEDs also include legacy mechanical or electromechanical devices that have been retrofitted with appropriate hardware and/or software allowing integration with the power management system.

Typically, an IED is associated with a particular load or set of loads that are drawing electrical power from the power distribution system. The IED may also be capable of receiving data from or controlling its associated load. Depending on the type of IED and the type of load it may be associated with, the IED implements a power management function that is able to respond to a power management command and/or generate power management data. Power management functions include measuring power consumption, controlling power distribution such as a relay function, monitoring power quality, measuring power parameters such as phasor components, voltage or current, controlling power generation facilities, computing revenue, controlling electrical power flow and load shedding, or combinations thereof.

The number of meters/IEDs to be serviced by a single entity may vary, for example, due to the size of the facility, the size of the utility company, the geographic location, etc. When the meters/IEDs are read remotely and produce seemingly inaccurate data, a field technician is typically dispatched to visually and physically inspect the meters, e.g., to determine if the meter is wired correctly. Depending on the number of meters to be inspected, this can be a daunting task. Therefore, a need exists for techniques for verifying a meter wiring setup without having to visually and physically inspect the meter at its installation location.

SUMMARY

In accordance with embodiments of the present disclosure, there are provided herein devices, methods and systems for meter setup verification.

In one embodiment, a client device, e.g., client computer, may include a suite of software utilities or modules for verifying the setup of an IED or meter. The meter setup verification feature provides a user with a list of possible problems detected with at least one meter and its associated system, so that the user can identify and correct faults quickly and easily. For example, the software utility or module may perform a wiring check, i.e., verifies voltage and current hookups are in the correct order and that the current transformers (CT's) are not reversed.

In one embodiment, the client device generates a notification indicating that a particular meter/IED is wired incorrectly. The notification may be in the form of a pop-up display or screen display on a display device coupled to the client device. In one aspect, the notification is at least one of an email, text message and/or voice message that may be transmitted to an end user or technician. In another aspect, the notification may include corrective measures to rectify the incorrect wiring. For example, the corrective measures may include instructions on how to rewire the meter/IED. In a further aspect, the corrective measures may include a selectable option, presented to the user via a user interface, to provide executable instructions to the meter/IED to rectify the incorrect wiring, e.g., by reassigning actual connections to the meter/IED to the proper expected value. In yet another aspect, the executable instructions may be provided to the meter/IED automatically without user intervention.

In another embodiment, the meter/IED may perform the meter setup verification. For example, a software utility or module disposed within a meter/IED may perform a wiring check, i.e., verifies voltage and current hookups are in the correct order and that the current transformers (CT's) are not reversed. In one embodiment, the meter/IED generates a notification indicating that it is wired incorrectly. The notification may be in the form of a pop-up display or screen display on a display device coupled to the meter/IED. In one aspect, the notification is at least one of an email, text message and/or voice message that may be transmitted to an end user or technician. In another aspect, the notification may include corrective measures to rectify the incorrect wiring. For example, the corrective measures may include instructions on how to rewire the meter/IED. In a further aspect, the corrective measures may include a selectable option, presented to the user via a user interface displayed on the display device, to enable executable instructions on the meter/IED to rectify the incorrect wiring, e.g., by reassigning actual connections to the meter/IED to the proper expected value. In yet another aspect, the executable instructions are initiated by the meter/IED automatically without user intervention.

In another embodiment, a device is provided for verifying a wiring setup of an electronic power meter, the device including: a communication interface that receives a wiring setup configuration of at least one electronic power meter and at least one measured and/or calculated parameter from the at least one electronic power meter; and at least one processor that determines if the at least one electronic power meter is wired correctly based on the wiring setup configuration of the at least one electronic power meter and the at least one measured and/or calculated parameter from the at least one electronic power meter.

In one aspect, the wiring setup configuration is one of a 3 Element Wye configuration and/or 2 CT Delta configuration.

In another aspect, the at least one measured parameter includes at least one of RMS voltage and/or RMS current.

In a further aspect, the at least one calculated parameter includes at least one of voltage phase angles and current phase angles.

In another aspect, the at least one processor generates a notification if the at least one processor determines the at least one electronic power meter is wired incorrectly.

In one aspect, the notification is at least one of an email, text message and/or voice message.

In yet another aspect, the notification includes corrective measures to rectify the incorrect wiring.

In another aspect, the at least one processor determines voltage and current phase angles based on the at least one measured and/or calculated parameter from the at least one electronic power meter.

In a further aspect, if the at least one processor determines that the at least one electronic power meter is wired incorrectly, the at least one processor generates executable instructions to rectify the determined incorrect wiring of the at least one electronic power meter and transmits the executable instructions to the at least one electronic power meter via the communication interface without user intervention.

In another aspect, if the at least one processor determines that the at least one electronic power meter is wired incorrectly, the at least one processor prompts a user via a user interface to initiate corrective measures; and if the user activates the corrective measures via the user interface, the at least one processor generates executable instructions to rectify the determined incorrect wiring of the at least one electronic power meter and transmits the executable instructions to the at least one electronic power via the communication interface.

In another embodiment, the present disclosure provides an electronic power meter for monitoring an electrical distribution system providing power to a load, the electronic power meter including: at least one sensor coupled to the electrical distribution system, the at least one sensor configured to measure at least one parameter of the electrical distribution system and generate at least one analog signal indicative of the at least one parameter; at least one analog-to-digital converter configured to receive the at least one analog signal and convert the at least one analog signal to at least one digital signal; at least one memory configured to store at least one first firmware, a wiring setup configuration of electronic power meter and at least one measured and/or calculated parameter of the electrical distribution system; and at least one processor that calculates parameters of the electrical distribution system and determines if the electronic power meter is wired correctly based on the wiring setup configuration of at least one electronic power meter and at least one measured and/or calculated parameter.

In one aspect, the wiring setup configuration is one of a 3 Element Wye configuration and/or 2 CT Delta configuration.

In another aspect, the at least one measured parameter includes at least one of RMS voltage and/or RMS current.

In a further aspect, the at least one calculated parameter includes at least one of voltage phase angles and/or current phase angles.

In still another aspect, the at least one processor generates a notification if the at least one processor determines the electronic power meter is wired incorrectly.

In a further aspect, the electronic meter further includes a display device that displays the notification.

In one aspect, the electronic meter includes further includes a communication interface that transmits the notification to an external device, wherein the notification is at least one of an email, text message and/or voice message.

In another aspect, the notification includes corrective measures to rectify the incorrect wiring.

In a further aspect, the at least one processor determines voltage and current phase angles based on the at least one measured and/or calculated parameter.

In one aspect, if the at least one processor determines that the at least one electronic power meter is wired incorrectly, the at least one processor generates at least one second firmware to rectify the determined incorrect wiring and executes the at least one second firmware without user intervention.

In another aspect, if the at least one processor determines that the at least one electronic power meter is wired incorrectly, the at least one processor prompts a user via a user interface to initiate corrective measures; and if the user activates the corrective measures via the user interface, the at least one processor generates at least one second firmware to rectify the determined incorrect wiring and executes the at least one second firmware.

BRIEF DESCRIPTION OF THE DRAWINGS

These and other objects, features and advantages of the present disclosure will be apparent from a consideration of the following Detailed Description considered in conjunction with the drawing Figures, in which.

DETAILED DESCRIPTION

Embodiments of the present disclosure will be described herein below with reference to the accompanying drawings. In the following description, well-known functions or constructions are not described in detail to avoid obscuring the present disclosure in unnecessary detail. The word "exemplary" is used herein to mean "serving as an example, instance, or illustration." Any configuration or design described herein as "exemplary" is not necessarily to be construed as preferred or advantageous over other configurations or designs. Herein, the phrase "coupled" is defined to mean directly connected to or indirectly connected with through one or more intermediate components. Such intermediate components may include both hardware and software based components.

It is further noted that, unless indicated otherwise, all functions described herein may be performed in either hardware or software, or some combination thereof. In one embodiment, however, the functions are performed by at least one processor, such as a computer or an electronic data processor, digital signal processor or embedded microcontroller, in accordance with code, such as computer program code, software, and/or integrated circuits that are coded to perform such functions, unless indicated otherwise.

It should be appreciated that the present disclosure can be implemented in numerous ways, including as a process, an apparatus, a system, a device, a method, or a computer readable medium such as a computer readable storage medium or a computer network where program instructions are sent over optical or electronic communication links.

Embodiments of the present disclosure will be described herein below with reference to the accompanying drawings.

As used herein, intelligent electronic devices ("IEDs") can be any device that senses electrical parameters and computes data including, but not limited to, Programmable Logic Controllers ("PLC's"), Remote Terminal Units ("RTU's"), electric power meters, panel meters, protective relays, fault recorders, phase measurement units, serial switches, smart input/output devices and other devices which are coupled with power distribution networks to manage and control the distribution and consumption of electrical power. A meter is a device that records and measures power events, power quality, current waveforms, voltage waveforms, harmonics, transients and other power disturbances. Revenue accurate meters ("revenue meters") relate to revenue accuracy electrical power metering devices with the ability to detect, monitor, report, quantify and communicate power quality information about the power that they are metering.

Figure 1:
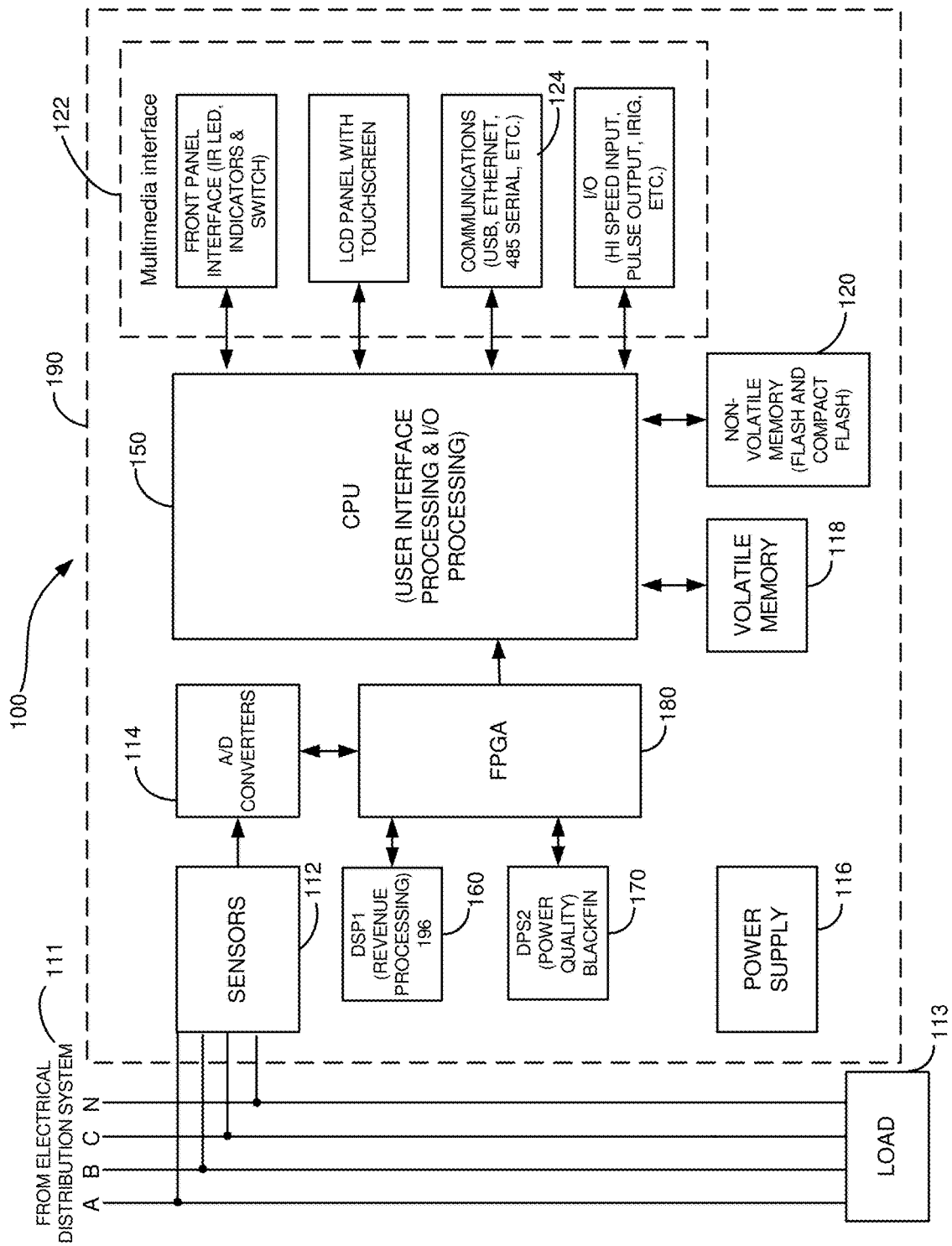
FIG. 1 is a block diagram of an intelligent electronic device (IED), according to an embodiment of the present disclosure.

FIG. 1 is a block diagram of an intelligent electronic device (IED) 10 for monitoring and determining power usage and power quality for any metered point within a power distribution system and for providing a data transfer system for faster and more accurate processing of revenue and waveform analysis.

The IED 100 of FIG. 1 includes a plurality of sensors 112 coupled to various phases A, B, C and neutral N of an electrical distribution system 111, a plurality of analog-to-digital (A/D) converters 114, including inputs coupled to the sensor 112 outputs, a power supply 116, a volatile memory 118, an non-volatile memory 120, a multimedia user interface 122, and a processing system that includes at least one central processing unit (CPU) 150 (or host processor) and/or one or more digital signal processors, two of which are shown, i.e., DSP1 160 and DSP2 170. The IED 100 may also include a Field Programmable Gate Array 180 which performs a number of functions, including, but not limited to, acting as a communications gateway for routing data between the various processors 150, 160, 170, receiving data from the A/D converters 114, performing transient detection and capture and performing memory decoding for CPU 150 and/or the DSP processor 160. In one embodiment, the FPGA 80 is internally comprised of two dual port memories to facilitate the various functions. It is to be appreciated that the various components shown in FIG. 1 are contained within a housing 190. Exemplary housings will be described below in relation to FIGS. 2A-2H.

The plurality of sensors 112 sense electrical parameters, e.g., voltage and current, on incoming lines (i.e., phase A, phase B, phase C, neutral N) of an electrical power distribution system 111, e.g., an electrical circuit, that are coupled to at least one load 113 that consumes the power provided. In one embodiment, the sensors 112 will include current transformers and potential transformers, wherein one current transformer and one voltage transformer will be coupled to each phase of the incoming power lines. A primary winding of each transformer will be coupled to the incoming power lines and a secondary winding of each transformer will output a voltage representative of the sensed voltage and current. The output of each transformer will be coupled to the A/D converters 114 configured to convert the analog output voltage from the transformer to a digital signal that can be processed by the CPU 150, DSP1 160, DSP2 170, FPGA 180 or any combination thereof.

A/D converters 114 are respectively configured to convert an analog voltage output to a digital signal that is transmitted to a gate array, such as Field Programmable Gate Array (FPGA) 180. The digital signal is then transmitted from the FPGA 180 to the CPU 150 and/or one or more DSP processors 160, 170 to be processed in a manner to be described below.

The CPU 150 and/or DSP Processors 160, 170 are configured to operatively receive digital signals from the A/D converters 114 (see FIG. 1) to perform calculations necessary to determine power usage and to control the overall operations of the IED 100. In some embodiments, CPU 150, DSP1 160 and DSP2 170 may be combined into a single processor, serving the functions of each component. In some embodiments, it is contemplated to use an Erasable Programmable Logic Device (EPLD) or a Complex Programmable Logic Device (CPLD) or any other programmable logic device in place of the FPGA 180. In some embodiments, the digital samples, which are output from the A/D converters 114 are sent directly to the CPU 150 or DSP processors 160, 170, effectively bypassing the FPGA 180 as a communications gateway.

The power supply 116 provides power to each component of the IED 100. In one embodiment, the power supply 116 is a transformer with its primary windings coupled to the incoming power distribution lines and having windings to provide a nominal voltage, e.g., 5 VDC, +12 VDC and −12 VDC, at its secondary windings. In other embodiments, power may be supplied from an independent power source to the power supply 116. For example, power may be supplied from a different electrical circuit or an uninterruptible power supply (UPS).

In one embodiment, the power supply 116 can be a switch mode power supply in which the primary AC signal will be converted to a form of DC signal and then switched at high frequency, such as, for example, 100 Khz, and then brought through a transformer to step the primary voltage down to, for example, 5 Volts AC. A rectifier and a regulating circuit would then be used to regulate the voltage and provide a stable DC low voltage output. Other embodiments, such as, but not limited to, linear power supplies or capacitor dividing power supplies are also contemplated.

The multimedia user interface 122 is shown coupled to the CPU 150 in FIG. 1 for interacting with a user and for communicating events, such as alarms and instructions to the user. The multimedia user interface 122 may include a display for providing visual indications to the user. The display may be embodied as a touch screen, a liquid crystal display (LCD), a plurality of LED number segments, individual light bulbs or any combination. The display may provide information to the user in the form of alpha-numeric lines, computer-generated graphics, videos, animations, etc. The multimedia user interface 122 further includes a speaker or audible output means for audibly producing instructions, alarms, data, etc. The speaker is coupled to the CPU 150 via a digital-to-analog converter (D/A) for converting digital audio files stored in a memory 118 or non-volatile memory 120 to analog signals playable by the speaker. An exemplary interface is disclosed and described in commonly owned U.S. Pat. No. 8,442,660, entitled "POWER METER HAVING AUDIBLE AND VISUAL INTERFACE", which claims priority to expired U.S. Provisional Patent Appl. No. 60/731,006, filed Oct. 28, 2005, the contents of which are hereby incorporated by reference in their entireties.

The IED 100 will support various file types including but not limited to Microsoft Windows Media Video files (.wmv), Microsoft Photo Story files (.asf), Microsoft Windows Media Audio files (.wma), MP3 audio files (.mp3), JPEG image files (.jpg, .jpeg, .jpe, .jfif), MPEG movie files (.mpeg, .mpg, .mpe, .m1v, .mp2v .mpeg2), Microsoft Recorded TV Show files (.dvr-ms), Microsoft Windows Video files (.avi) and Microsoft Windows Audio files (.wav).

The IED 100 further comprises a volatile memory 118 and a non-volatile memory 120. In addition to storing audio and/or video files, volatile memory 118 will store the sensed and generated data for further processing and for retrieval when called upon to be displayed at the IED 100 or from a remote location. The volatile memory 118 includes internal storage memory, e.g., random access memory (RAM), and the non-volatile memory 120 includes removable and/or non-removable memory such as magnetic storage memory; optical storage memory, e.g., the various types of CD and DVD media; solid-state storage memory, e.g., a Compact-Flash card, a Memory Stick, SmartMedia card, MultiMediaCard (MMC), SD (Secure Digital) memory; or any other memory storage that exists currently or will exist in the future. By utilizing removable memory, an IED can be easily upgraded as needed. Such memory will be used for storing historical trends, waveform captures, event logs including time-stamps and stored digital samples for later downloading to a client application, web-server or PC application.

In a further embodiment, the IED 100 will include a communication device 124, also known as a network or communication interface, for enabling communications between the IED or meter, and a remote terminal unit, programmable logic controller and other computing devices, microprocessors, a desktop computer, laptop computer, other meter modules, etc. The communication device 124 may be a modem, network interface card (NIC), wireless transceiver, etc. The communication device 124 will perform its functionality by hardwired and/or wireless connectivity. The hardwire connection may include but is not limited to hard wire cabling, e.g., parallel or serial cables, RS232, RS485, USB cable, Firewire (1394 connectivity) cables, Ethernet, and the appropriate communication port configuration. The wireless connection may operate under any of the various wireless protocols including but not limited to Bluetooth™ interconnectivity, infrared connectivity, radio transmission connectivity including computer digital signal broadcasting and reception commonly referred to as Wi-Fi or 802.11.X (where x denotes the type of transmission), satellite transmission or any other type of communication protocols, communication architecture or systems currently existing or to be developed for wirelessly transmitting data including spread spectrum 900 MHz, or other frequencies, Zigbee, WiFi, or any mesh enabled wireless communication.

The IED 100 may communicate to a server or other computing device via the communication device 124. The IED 100 may be connected to a communications network, e.g., the Internet, by any means, for example, a hardwired or wireless connection, such as dial-up, hardwired, cable, DSL, satellite, cellular, PCS, wireless transmission (e.g., 802.11a/b/g), etc. It is to be appreciated that the network may be a local area network (LAN), wide area network (WAN), the Internet or any network that couples a plurality of computers to enable various modes of communication via network messages. Furthermore, the server will communicate using various protocols such as Transmission Control Protocol/Internet Protocol (TCP/IP), File Transfer Protocol (FTP), Hypertext Transfer Protocol (HTTP), etc. and secure protocols such as Hypertext Transfer Protocol Secure (HTTPS), Internet Protocol Security Protocol (IPSec), Point-to-Point Tunneling Protocol (PPTP), Secure Sockets Layer (SSL) Protocol, etc. The server may further include a storage medium for storing a data received from at least one IED or meter and/or storing data to be retrieved by the IED or meter.

In an additional embodiment, the IED 100 may also have the capability of not only digitizing waveforms, but storing the waveform and transferring that data upstream to a central computer, e.g., a remote server, when an event occurs such as a voltage surge or sag or a current short circuit. This data may be triggered and captured on an event, stored to memory, e.g., non-volatile RAM, and additionally transferred to a host computer within the existing communication infrastructure either immediately in response to a request from a remote device or computer to receive said data or in response to a polled request. The digitized waveform will also allow the CPU 150 to compute other electrical parameters such as harmonics, magnitudes, symmetrical components and phasor analysis. Using the harmonics, the IED 100 will also calculate dangerous heating conditions and can provide harmonic transformer derating based on harmonics found in the current waveform.

In a further embodiment, the IED 100 will execute an e-mail client and will send e-mails to the utility or to the customer direct on an occasion that a power quality event occurs. This allows utility companies to dispatch crews to repair the condition. The data generated by the meters are used to diagnose the cause of the condition. The data is transferred through the infrastructure created by the electrical power distribution system. The email client will utilize a POP3 or other standard mail protocol. A user will program the outgoing mail server and email address into the meter. An exemplary embodiment of said metering is described in U.S. Pat. No. 6,751,563, which all contents thereof are incorporated by reference herein.

The techniques of the present disclosure can be used to automatically maintain program data and provide field wide updates upon which IED firmware and/or software can be upgraded. An event command can be issued by a user, on a schedule or by digital communication that will trigger the IED 100 to access a remote server and obtain the new program code. This will ensure that program data will also be maintained allowing the user to be assured that all information is displayed identically on all units.

It is to be understood that the present disclosure may be implemented in various forms of hardware, software, firmware, special purpose processors, or a combination thereof. The IED 10 also includes an operating system and micro instruction code. The various processes and functions described herein may either be part of the micro instruction code or part of an application program (or a combination thereof) which is executed via the operating system.

It is to be further understood that because some of the constituent system components and method steps depicted in the accompanying figures may be implemented in software, or firmware, the actual connections between the system components (or the process steps) may differ depending upon the manner in which the present disclosure is programmed. Given the teachings of the present disclosure provided herein, one of ordinary skill in the related art will be able to contemplate these and similar implementations or configurations of the present disclosure.

Figure 2A:
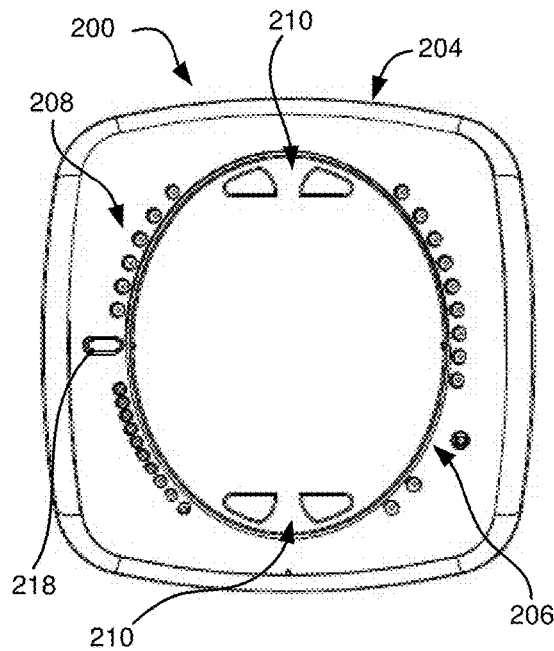
FIGS. 2A-2H illustrate exemplary form factors for an intelligent electronic device (IED) in accordance with an embodiment of the present disclosure.
Figure 2B:
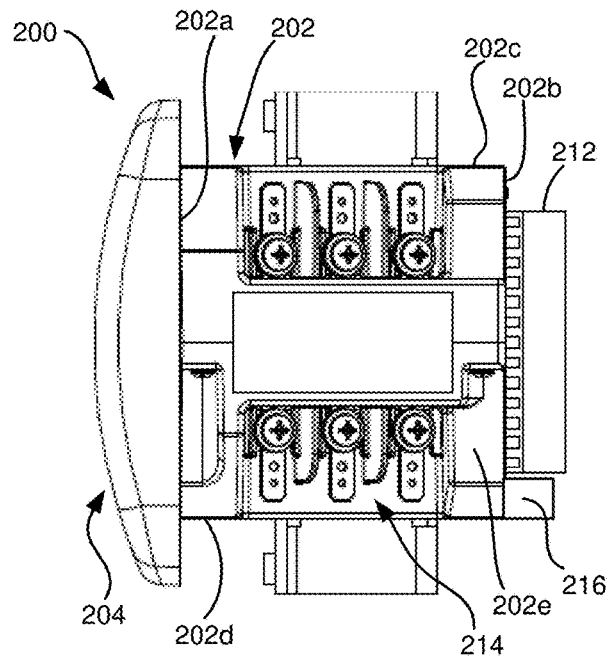

Furthermore, it is to be appreciated that the components and devices of the IED 10 of FIG. 1 may be disposed in various housings depending on the application or environment. For example, the IED 100 may be configured as a panel meter 200 as shown in FIG. 2A an 2B. The panel meter 200 of FIGS. 2A and 2B is described in more detail in commonly owned U.S. Pat. No. 7,271,996, the contents of which are hereby incorporated by reference. As seen in FIGS. 2A and 2B, the IED 200 includes a housing 202 defining a front surface 202a, a rear surface 202b, a top surface 202c, a bottom surface 202d, a right side surface 202e, and a left side surface (not shown). Electrical device 200 includes a face plate 204 operatively connected to front surface 202a of housing 202. Face plate 204 includes displays 206, indicators 208 (e.g., LEDs and the like), buttons 210, and the like providing a user with an interface for visualization and operation of electrical device 200. For example, as seen in FIG. 2A, face plate 204 of electrical device 200 includes analog and/or digital displays 206 capable of producing alphanumeric characters. Face plate 204 includes a plurality of indicators 208 which, when illuminated, indicate to the user the "type of reading", the "% of load bar", the "parameter designation" which indicates the reading which is being displayed on displays 206, a "scale selector" (e.g., Kilo or Mega multiplier of Displayed Readings), etc. Face plate 204 includes a plurality of buttons 210 (e.g., a "menu" button, an "enter" button, a "down" button, a "right" button, etc.) for performing a plurality of functions, including and not limited to: viewing of meter information; enter display modes; enter configuring parameters; performing re-sets; performing LED checks; changing settings; viewing parameter values; scrolling parameter values; and viewing limit states. The housing 202 includes voltage connections or inputs 212 provided on rear surface 202b thereof, and current inputs 214 provided along right side surface 202e thereof. The IED 200 may include a first interface or communication port 216 for connection to a master and/or slave device. Desirably, first communication port 216 is situated in rear surface 202b of housing 202. IED 200 may also include a second interface or communication port 218 situated on face plate 204.

Figure 2C:
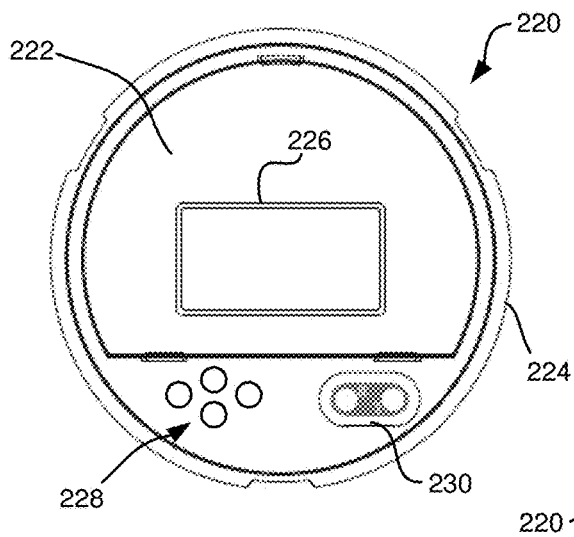
Figure 2D:
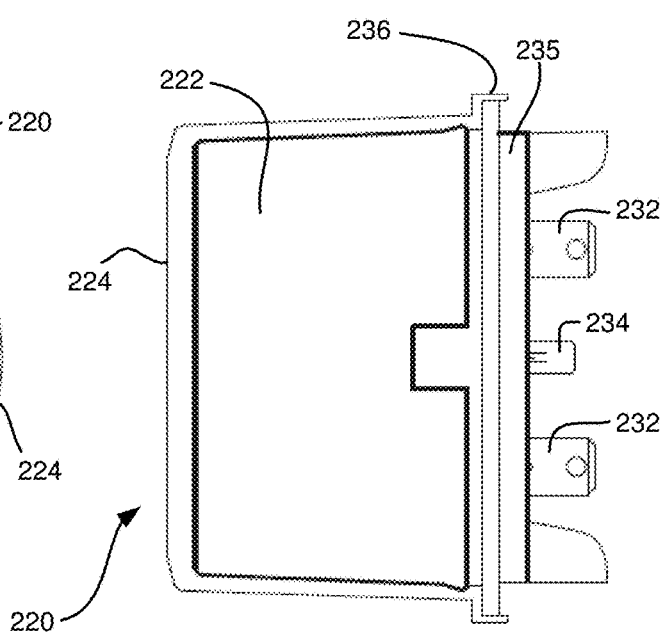

In other embodiment, the IED 100 may be configured as a socket meter 220, also known as a S-base type meter or type S meter, as shown in FIG. 2C an 2D. An exemplary socket meter is described in more detail in commonly owned U.S. Pat. No. 8,717,007, the contents of which are hereby incorporated by reference. Referring to FIGS. 2C and 2D, the meter 220 includes a main housing 222 surrounded by a cover 224. The cover 224 is preferably made of a clear material to expose a display 226 disposed on the main body 222. An interface 228, to access the display and interact with the IED, and a communication port 230 are also provided and accessible through the cover 224. The meter 220 further includes a plurality of current terminals 232 and voltage terminals 234 disposed on backside of the meter extending through a base 235. The terminals 232, 234 are designed to mate with matching jaws of a detachable meter-mounting device, such as a revenue meter socket. The socket is hard wired to the electrical circuit and is not meant to be removed. To install an S-base meter, the utility need only plug in the meter into the socket. Once installed, a socket-sealing ring 236 is used as a seal between the meter 220 and/or cover 224 and the meter socket to prevent removal of the meter and to indicate tampering with the meter.

Figure 2E:
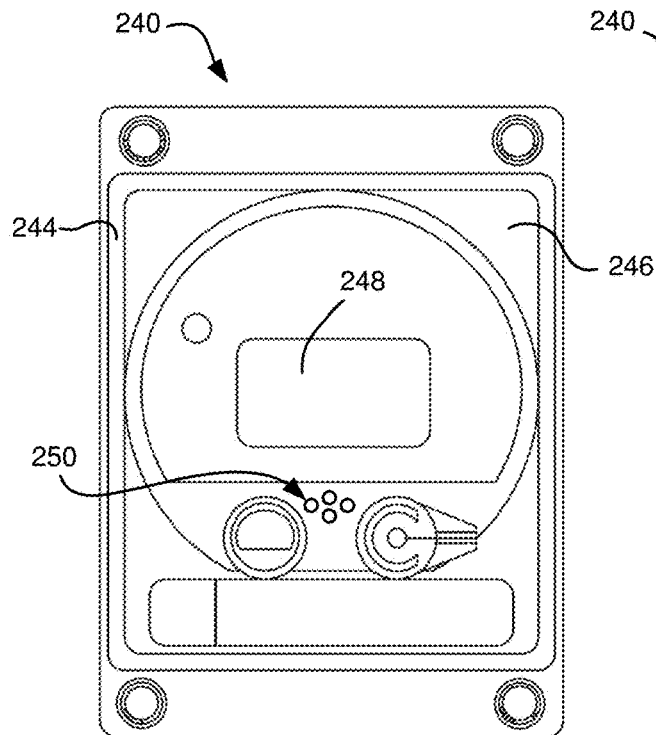
Figure 2F:
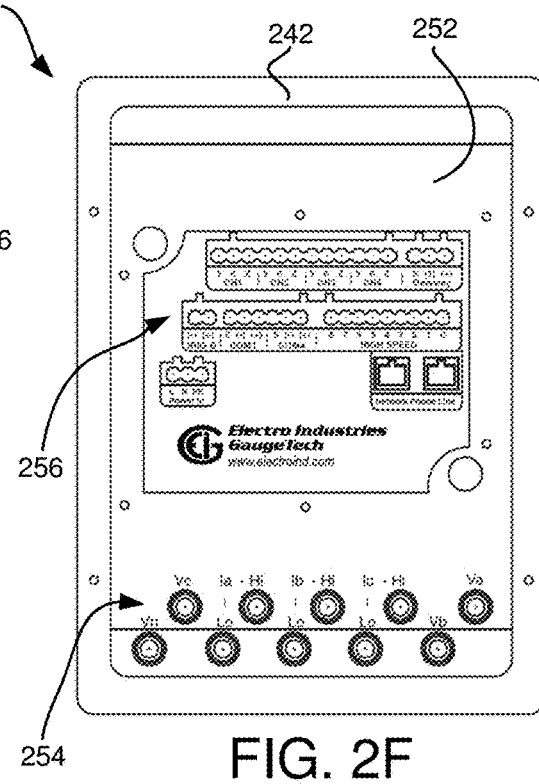

In a further embodiment, the IED 100 of FIG. 1 may be disposed in a switchboard or draw-out type housing 240 as shown in FIGS. 2E and 2F, where FIG. 2E is a front view and FIG. 2F is a rear view. The switchboard enclosure 242 usually features a cover 244 with a transparent face 246 to allow the meter display 248 to be read and the user interface 250 to be interacted with by the user. The cover 244 also has a sealing mechanism (not shown) to prevent unauthorized access to the meter. A rear surface 252 of the switchboard enclosure 242 provides connections for voltage and current inputs 254 and for various communication interfaces 256. Although not shown, the meter disposed in the switchboard enclosure 242 may be mounted on a draw-out chassis which is removable from the switchboard enclosure 242. The draw-out chassis interconnects the meter electronics with the electrical circuit. The draw-out chassis contains electrical connections which mate with matching connectors 254, 256 disposed on the rear surface 252 of the enclosure 242 when the chassis is slid into place.

Figure 2G:
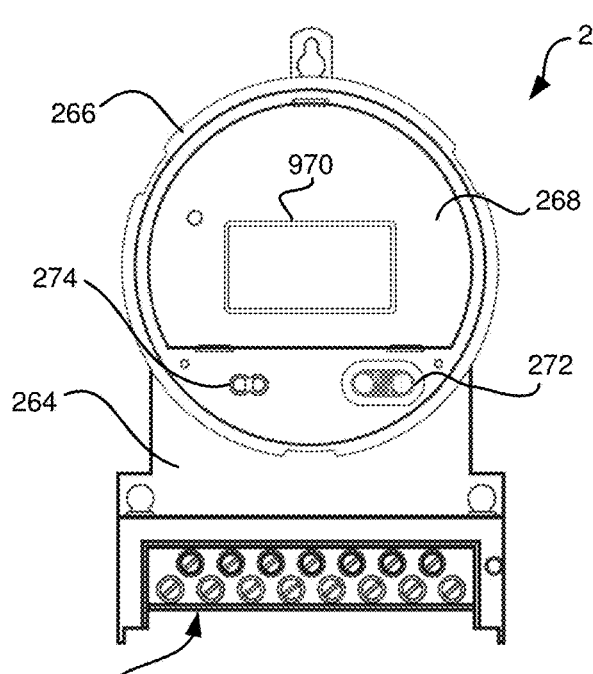
Figure 2H:
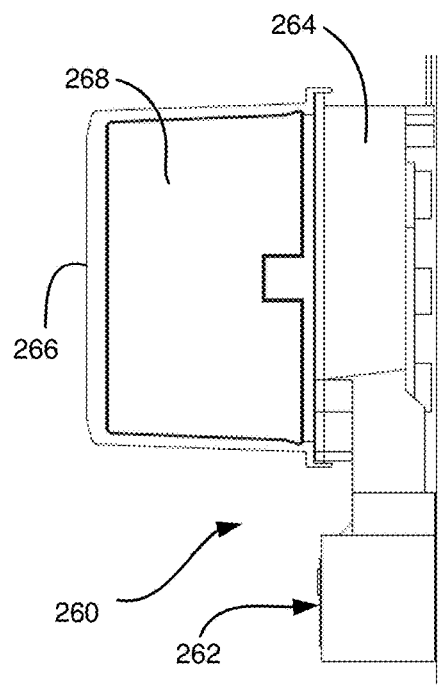

In yet another embodiment, the IED 100 of FIG. 1 may be disposed in an A-base or type A housing as shown in FIGS. 2G and 2H. A-base meters 260 feature bottom connected terminals 262 on the bottom side of the meter housing 264. These terminals 262 are typically screw terminals for receiving the conductors of the electric circuit (not shown). A-base meters 260 further include a meter cover 266, meter body 268, a display 270 and input/output means 272. Further, the meter cover 266 includes an input/output interface 274 for interacting with the IED. The cover 266 encloses the meter electronics 268 and the display 270. The cover 266 has a sealing mechanism (not shown) which prevents unauthorized tampering with the meter electronics.

It is to be appreciated that other housings and mounting schemes, e.g., circuit breaker mounted, are contemplated to be within the scope of the present disclosure.

Figure 3:
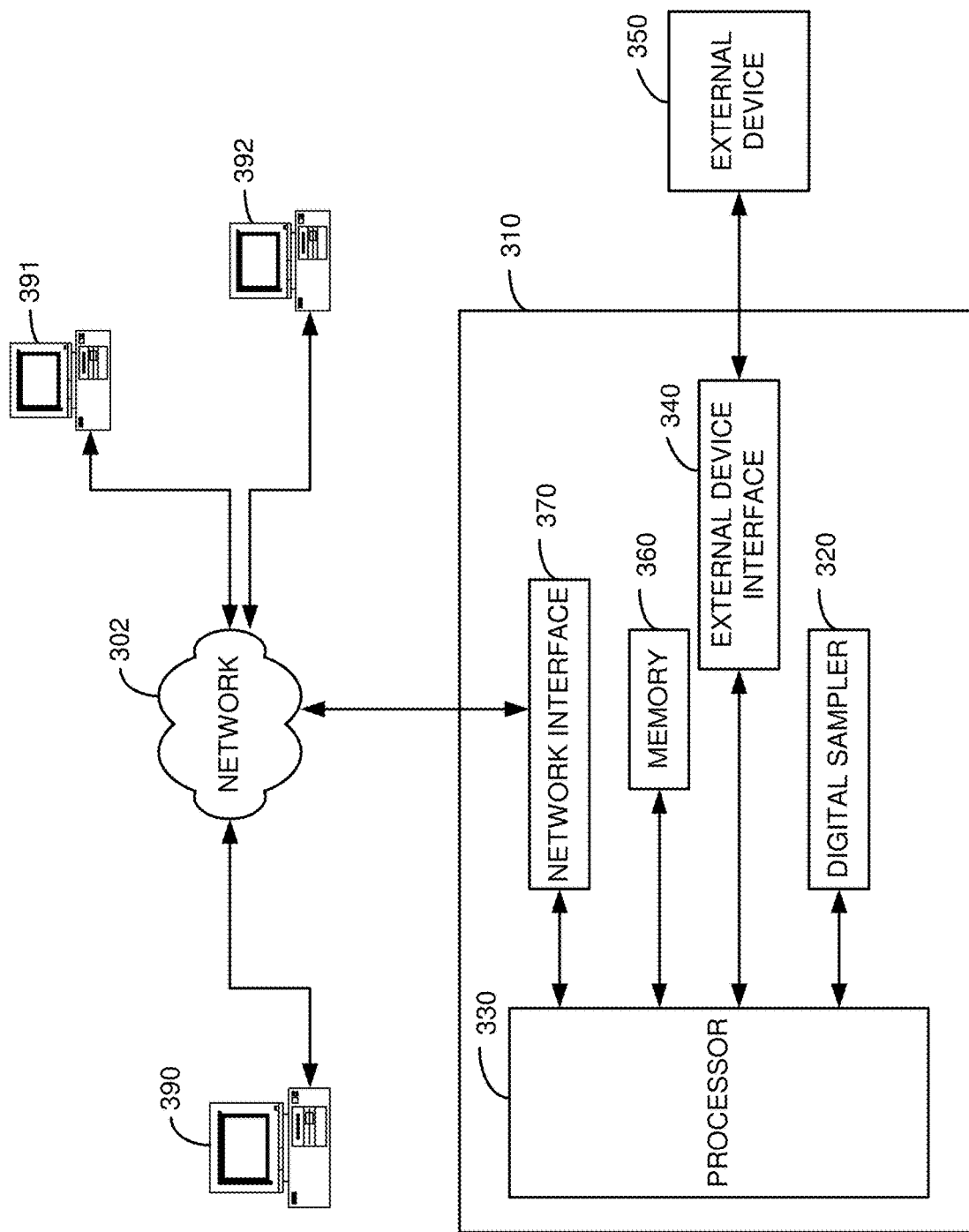
FIG. 3 illustrates an environment in which the present disclosure may be utilized.

FIG. 3 illustrates an exemplary environment 300 in which the present disclosure may be practiced. The environment 300 includes at least one IED 310 and at least one computing device 390, 391, 392. The network 302 may be the Internet, a public or private intranet, an extranet, wide area network (WAN), local area network (LAN) or any other network configuration to enable transfer of data and commands. An example network configuration uses the Transport Control Protocol/Internet Protocol ("TCP/IP") network protocol suite, however, other Internet Protocol based networks are contemplated by the present disclosure. Communications may also include IP tunneling protocols such as those that allow virtual private networks coupling multiple intranets or extranets together via the Internet. The network 302 may support existing or envisioned application protocols, such as, for example, telnet, POPS, Mime, HTTP, HTTPS, PPP, TCP/IP, SMTP, proprietary protocols, or any other network protocols. During operation, the IED 310 may communicate using the network 302 as will be hereinafter discussed.

It is to be appreciated that are at least two basic types of networks, based on the communication patterns between the machines: client/server networks and peer-to-peer networks. On a client/server network, every computer, device or IED has a distinct role: that of either a client or a server. A server is designed to share its resources among the client computers on the network. A dedicated server computer often has faster processors, more memory, and more storage space than a client because it might have to service dozens or even hundreds of users at the same time. High-performance servers typically use from two to eight processors (and that's not counting multi-core CPUs), have many gigabytes of memory installed, and have one or more server-optimized network interface cards (NICs), RAID (Redundant Array of Independent Drives) storage consisting of multiple drives, and redundant power supplies. Servers often run a special network OS—such as Windows Server, Linux, or UNIX—that is designed solely to facilitate the sharing of its resources. These resources can reside on a single server or on a group of servers. When more than one server is used, each server can "specialize" in a particular task (file server, print server, fax server, email server, and so on) or provide redundancy (duplicate servers) in case of server failure. For demanding computing tasks, several servers can act as a single unit through the use of parallel processing. A client device typically communicates only with servers, not with other clients. A client system may be a standard PC that is running an OS such as Windows, Linux, etc. Current OSes contain client software that enables the client computers to access the resources that servers share. Older OSes, such as Windows 3.x and DOS, required add-on network client software to join a network. By contrast, on a peer-to-peer network, every computer or device is equal and can communicate with any other computer or device on the network to which it has been granted access rights. Essentially, every computer or device on a peer-to-peer network can function as both a server and a client; any computer or device on a peer-to-peer network is considered a server if it shares a printer, a folder, a drive, or some other resource with the rest of the network. Note that the actual networking hardware (interface cards, cables, and so on) is the same in client/server versus peer-to-peer networks, it is only the logical organization, management and control of the network that varies.

A client may comprise any computing device, such as a server 390, mainframe, workstation, personal computer 391, 392, hand held computer, laptop telephony device, network appliance, an IED 310, Programmable Logic Controller, Power Meter, Protective Relay etc. The client may include system memory, which may be implemented in volatile and/or non-volatile devices, and one or more client applications which may execute in the system memory. Such client applications may include, for example, FTP client applications. File Transfer Protocol (FTP) is an application for transfer of files between computers attached to Transmission Control Protocol/Internet Protocol (TCP/IP) networks, including the Internet. FTP is a "client/server" application, such that a user runs a program on one computer system, the "client", which communicates with a program running on another computer system, the "server". In one embodiment, IED 310 includes at least an FTP server.

While FTP file transfer comprises one embodiment for encapsulating files to improve a data transfer rate from an IED to external clients, the present disclosure contemplates the use of other file transfer protocols, such as the Ethernet protocol such as HTTP or TCP/IP for example. Of course, other Ethernet protocols are contemplated for use by the present disclosure. For example, for the purpose of security and firewall access, it may be preferable to utilize HTTP file encapsulation as opposed to sending the data via FTP. In other embodiments, data can be attached as an email and sent via SMTP, for example. Such a system is described in a co-owned U.S. Pat. No. 6,751,563, titled "Electronic Energy meter", the contents of which are incorporated herein by reference. In the U.S. Pat. No. 6,751,563, at least one processor of the IED or meter is configured to collect the at least one parameter and generate data from the sampled at least one parameter, wherein the at least one processor is configured to act as a server for the IED or meter and is further configured for presenting the collected and generated data in the form of web pages, as will be described in relation to FIG. 3.

IED 310 includes a digital sampler 320 for digitally sampling the voltage and current of the power being supplied to a customer or monitored at the point of the series connection in the power grid. Digital sampler 320 digitally samples the voltage and current and performs substantially similar to the A/D converters 114 described above in relation to FIG. 1. The digital samples are then forwarded to processor 330 for processing. It is to be appreciated that the processor may be a single processing unit or a processing assembly including at least one CPU 150, DSP1 160, DSP2 170 and FPGA 180, or any combination thereof. Also connected to processor 330 is external device interface 340 for providing an interface for external devices 350 to connect to meter 310. These external devices might include other power meters, sub-station control circuitry, on/off switches, etc. Processor 330 receives data packets from digital sampler 320 and external devices 350, and processes the data packets according to user defined or predefined requirements. A memory 360 is connected to processor 330 for storing data packets and program algorithms, and to assist in processing functions of processor 330. These processing functions include the power quality data and revenue calculations, as well as formatting data into different protocols which will be described later in detail. Processor 330 provides processed data to network 302 through network interface 370, similar to the communication device 124 described above in relation to FIG. 1 In one embodiment, the network interface converts the data to an Ethernet TCP/IP format. The use of the Ethernet TCP/IP format allows multiple users to access the power meter simultaneously. In a like fashion, network interface 370 might be comprised of a modem, cable connection, or other devices that provide formatting functions.

A web server program (web server) is contained in memory 360, and accessed through network or communication interface 370. The web server provides real time data through any known web server interface format. For example, popular web server interface formats consist of HTML and XML formats. The actual format of the programming language used is not essential to the present disclosure, in that any web server format can be incorporated herein. The web server provides a user-friendly interface for the user to interact with the meter 310. The user can have various access levels to enter limits for e-mail alarms. Additionally, the user can be provided the data in a multiple of formats including raw data, bar graph, charts, etc. The currently used HTML or XML programming languages provide for easy programming and user-friendly user interfaces.

The processor 330 formats the processed data into various network protocols and formats. The protocols and formats can, for example, consist of the web server HTML or XML formats, Modbus TCP, RS-485, FTP or e-mail. Dynamic Host Configuration Protocol (DHCP) can also be used to assign IP addresses. The network formatted data is now available to users at computers 390-392 through network 302, that connects to meter 310 at the network interface 370. In one embodiment, network interface 370 is an Ethernet interface that supports, for example, 100 base-T or 10 base-T communications. This type of network interface can send and receive data packets between WAN connections and/or LAN connections and the meter 310. This type of network interface allows for situations, for example, where the web server may be accessed by one user while another user is communicating via the Modbus TCP, and a third user may be downloading a stored data file via FTP. The ability to provide access to the meter by multiple users, simultaneously, is a great advantage over the prior art. This can allow for a utility company's customer service personnel, a customer and maintenance personnel to simultaneously and interactively monitor and diagnose possible problems with the power service.

Figure 4:
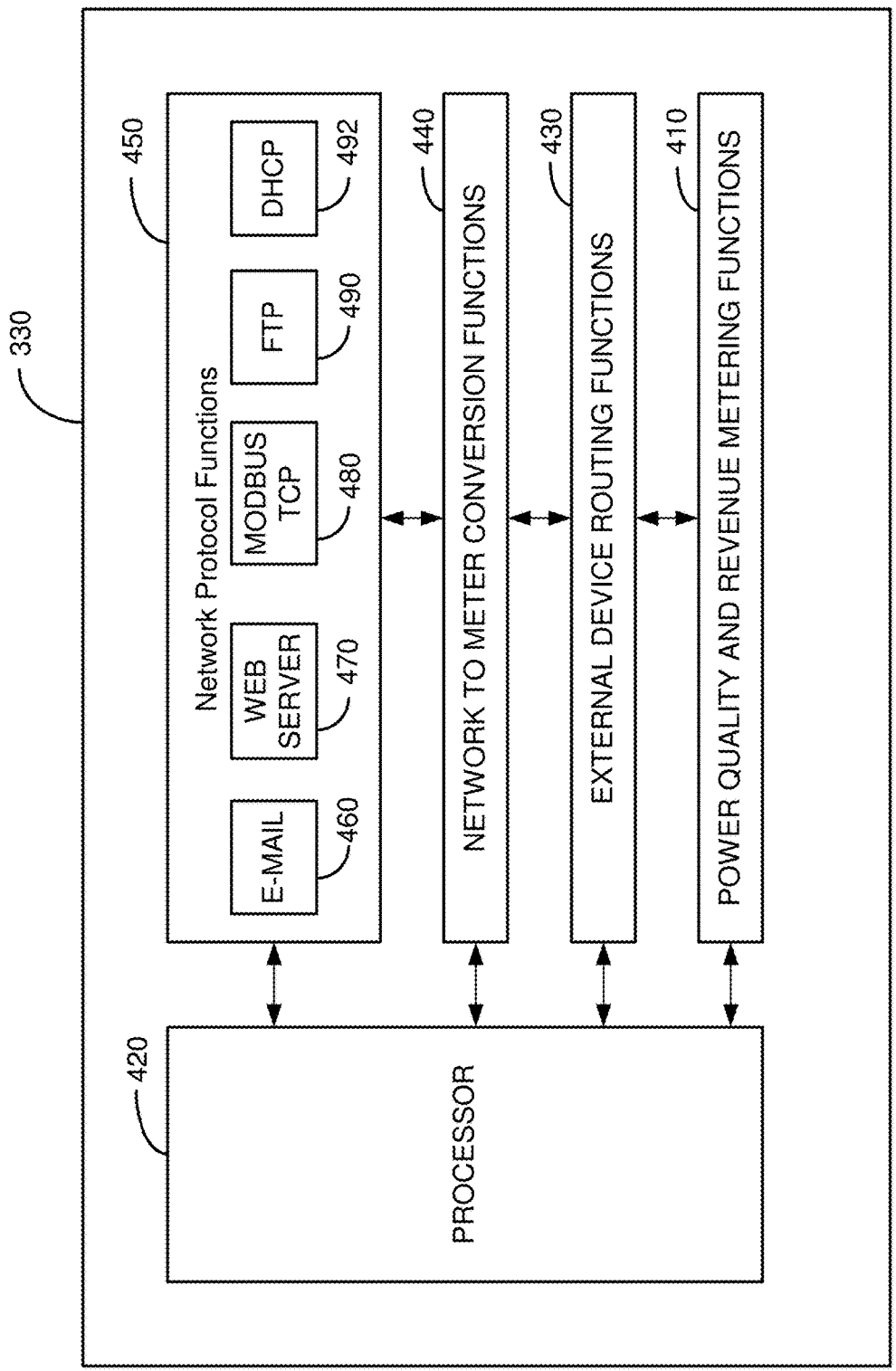
FIG. 4 is a functional block diagram of a processor of an intelligent electronic device according to an embodiment of the present disclosure.

FIG. 4 is a functional block diagram of processor 330 according to the embodiment of the present disclosure. Processor 330 is shown containing at least four main processing functions. The functions shown are illustrative and not meant to be inclusive of all possible functions performed by processor 330. Power Quality and Revenue Metering functions (metering functions) 410 consists of a complete set of functions which are needed for power quality and revenue metering. Packet data collected by digital sampler 320 is transmitted to processor 330. Processor 330 calculates, for example, power reactive power, apparent power, and power factor. The metering function 410 responds to commands via the network or other interfaces supported by the meter. External Device Routing Functions 430 handle the interfacing between the external device 350 and meter 310. Raw data from external device 350 is fed into meter 310. The external device 350 is assigned a particular address. If more than one external device is connected to meter 310, each device will be assigned a unique particular address. The Network Protocol Functions 450 of meter 310 are executed by processor 330 which executes multiple networking tasks that are running concurrently. As shown in FIG. 4, these include, but are not limited to, the following network tasks included in network protocol functions 450: e-mail 460, web server 470, Modbus TCP 480, FTP 490, and DHCP 492. The e-mail 460 network protocol function can be utilized to send e-mail messages via the network 302 to a user to, for example, notify the user of an emergency situation or if the power consumption reaches a user-set or pre-set high level threshold. As the processor receives packets of data it identifies the network processing necessary for the packet by the port number associated with the packet. The processor allocates the packet to a task as a function of the port number. Since each task is running independently the meter 310 can accept different types of requests concurrently and process them transparently from each other. For example, the web server may be accessed by one user while another user is communicating via Modbus TCP and at the same time a third user may download a log file via FTP. The Network to Meter Protocol Conversion Function 440 is used to format and protocol convert the different network protocol messages to a common format understood by the other functional sections of meter 310. After the basic network processing of the packet of data, any "commands" or data which are to be passed to other functional sections of meter 310 are formatted and protocol converted to a common format for processing by the Network to Meter Protocol Conversion Function 440. Similarly, commands or data coming from the meter for transfer over the network are pre-processed by this function into the proper format before being sent to the appropriate network task for transmission over the network. In addition, this function first protocol converts and then routes data and commands between the meter and external devices.

Although the above described embodiments enable users outside of the network the IED or meter is residing on to access the internal memory or server of the IED or meter, IT departments commonly block this access through a firewall to avoid access by dangerous threats into corporate networks. A firewall is a system designed to prevent unauthorized access to or from a private network, e.g., an internal network of a building, a corporate network, etc. Firewalls can be implemented in both hardware and software, or a combination of both. Firewalls are frequently used to prevent unauthorized Internet users from accessing private networks connected to the Internet, especially intranets. All messages entering or leaving the intranet pass through the firewall, which examines each message and blocks those that do not meet the specified security criteria. A firewall may employ one or more of the following techniques to control the flow of traffic in and of the network it is protecting: 1) packet filtering: looks at each packet entering or leaving the network and accepts or rejects it based on user-defined rules; 2) Application gateway: applies security mechanisms to specific applications, such as FTP and Telnet servers; 3) Circuit-level gateway: applies security mechanisms when a TCP or UDP connection is established, once the connection has been made, packets can flow between the hosts without further checking; 4) Proxy server: intercepts all messages entering and leaving the network, effectively hides the true network addresses; and 5) Stateful inspection: doesn't examine the contents of each packet but instead compares certain key parts of the packet to a database of trusted information, if the comparison yields a reasonable match, the information is allowed through, otherwise it is discarded. Other techniques and to be developed techniques are contemplated to be within the scope of the present disclosure.

In one embodiment, the present disclosure provides for overcoming the problem of not being allowed firewall access to an IED or meter installed within a facility, i.e., the meter is residing on a private network, by enabling an IED to initiate one-way communication through the firewall. In this embodiment, the IED or meter posts the monitored and generated data on an Internet site external to the corporate or private network, i.e., on the other side of a firewall. The benefit is that any user would be able to view the data on any computer or web enabled smart device without having to pierce or bypass the firewall. Additionally, there is a business opportunity to host this data on a web server and charge a user a monthly fee for hosting the data. The features of this embodiment can be incorporated into any telemetry application including vending, energy metering, telephone systems, medical devices and any application that requires remotely collecting data and posting it on to a public Internet web site.

Figure 5:
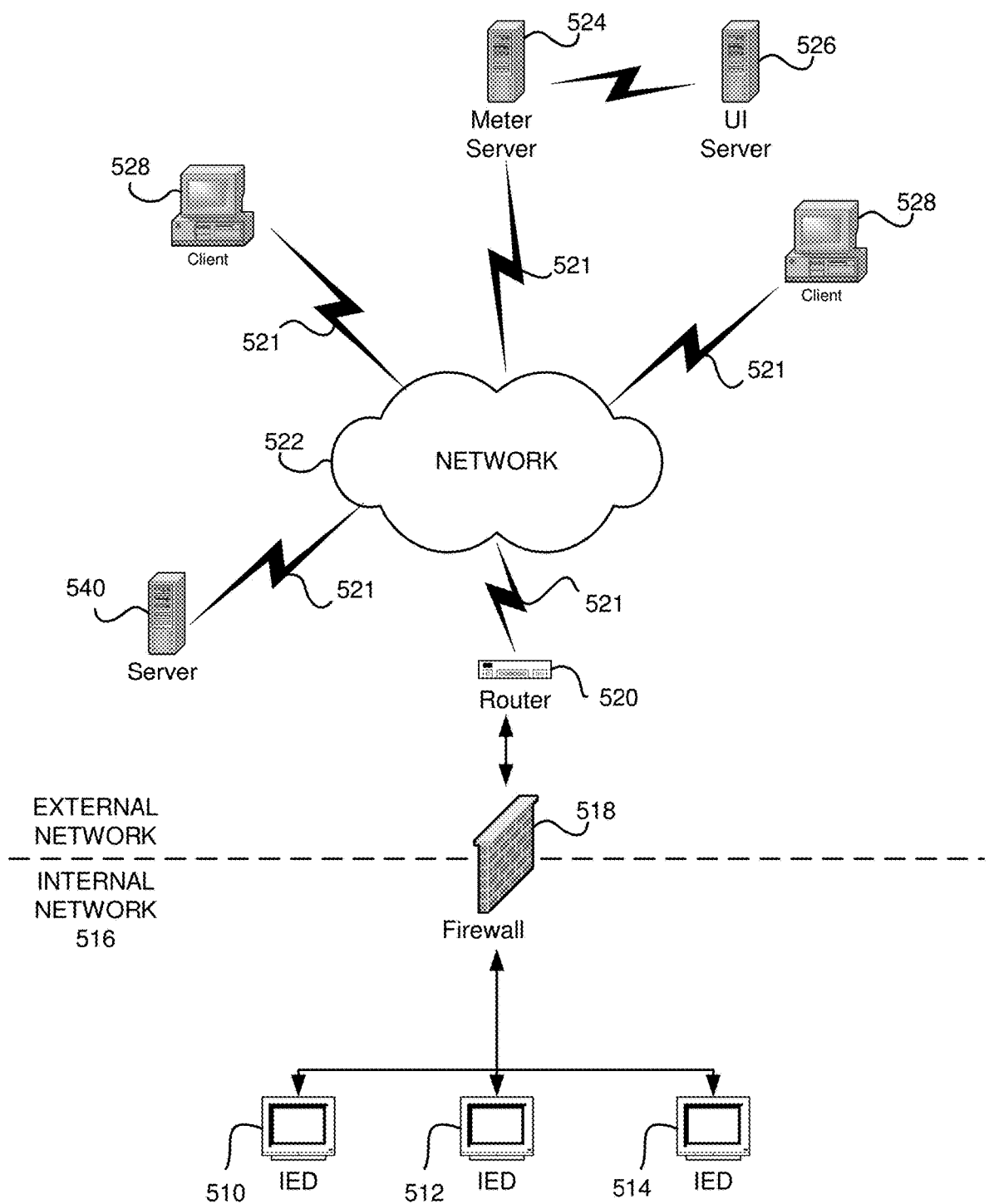
FIG. 5 illustrates another environment in which the present disclosure may be utilized.

In one embodiment, the IED or metering device will communicate through the firewall using a protocol such as HTTP via a port that is open through the firewall. Referring to FIG. 5, IEDs or meters 510, 512, 514 reside on an internal network 516, e.g., an intranet, private network, corporate network, etc. The internal network 516 is coupled to an external network 522, e.g., the Internet, via a router 520 or similar device over any known hardwire or wireless connection 521. A firewall 518 is disposed between the internal network 516 and external network 522 to prevent unauthorized access from outside the internal network 516 to the IEDs or meters 510, 512, 514. Although the firewall 518 is shown between the internal network 516 and the router 520 it is to be appreciated that other configurations are possible, for example, the firewall 518 being disposed between the router 520 and external network 522. In other embodiments, the firewall 518 and router 520 may be configured as a single device. It is further to be appreciated that firewall 518 can be implemented in both hardware and software, or a combination of both.

The communication device or network interface of the meter (as described above in relation to FIGS. 1 and 4) may communicate through the firewall 518 and read a web site server 524. It is to be appreciated that the one way communication from the IED through the firewall may be enabled by various techniques, for example, by enabling outbound traffic to the IP address or domain name of the server 524 or by using a protocol that has been configured, via the firewall settings, to pass through the firewall such as HTTP (Hyper Text Transfer Protocol), IP (Internet Protocol), TCP (Transmission Control Protocol), FTP (File Transfer Protocol), UDP (User Datagram Protocol), ICMP (Internet Control Message Protocol), SMTP (Simple Mail Transport Protocol), SNMP (Simple Network Management Protocol), Telnet, etc. Alternatively, the IED may have exclusive access to a particular port on the firewall, which is unknown to other users on either the internal or external network. Other methods or techniques are contemplated, for example, e-mail, HTTP tunneling, SNTP trap, MSN, messenger, IRQ, Twitter™, Bulletin Board System (BBS), forums, Universal Plug and Play (UPnP), User Datagram Protocol (UDP) broadcast, UDP unicast, Virtual Private Networks (VPN), etc.

The server 524 will provide instructions in computer and/or human readable format to the IED or meter. For instance, the web server 524 might have XML tags that state in computer readable format to provide data for the last hour on energy consumption by 15 minute intervals. The meter 510, 512, 514 will then read those instructions on that web server 524 and then post that data up on the server 524. In this manner, the IED or meter initiates communication in one direction, e.g., an outbound direction, to the server 524.

Another server (or can be in one server) will read the data that the meter 510, 512, 514 posts and will format the meter data into data that can be viewed for humans on a web site or a software application, i.e., UI Server 526. Servers 524, 526 can also store the data in a database or perform or execute various control commands on the data. Clients 528 may access the IED data stored or posted on servers 524, 526 via a connection to the network 522.

Since the meters are only communicating in an outbound direction only, the meters 510, 512, 514 can read data or instructions from an external network application (e.g., server 524), the external network application cannot request information directly from the meter. The server 524 posts the data or instructions on the web site and waits for the meter to check the site to see if there has been a new post, i.e., new instructions for the meter. The meter can be programmed at the user's discretion as to frequency for which the meter 510, 512, 514 exits out to the external network to view the postings.

The meter instruction server 524 will post instructions in a directory programmed/located on the server or into XML or in any fashion that the meter is configured to understand and then the meter will post whatever data it is instructed to do. The meter can also be configured to accomplish control commands. In addition to the meter instruction server 524, a user interface (UI) server 526 is provided that can be used to enable a user interface to the user. The user can provide input on the UI server 526 that might trigger the meter instruction server 524 to produce a message to control the energy next time the meter reads that server.

In another embodiment, the IED or metering device will communicate through the firewall using a server (not shown) disposed on an internal network protected by a firewall. In this embodiment, the server aggregates data from the various IEDs 510, 512, 514 coupled to the internal or private network 516. Since the server and the IEDs 510, 512, 514 are all on the same side of the firewall 518, generally communications and data transfers among the server and the IEDs 510, 512, 514 is unrestricted. The server then communicates or transfers the data from the IEDs to server 524 on the external network on the other side of the firewall 518. The communication between server on the internal network and server 524 may be accomplished by any one of the communication means or protocols described in the present disclosure. The server 524 then posts the data from the IEDs 510, 512, 514 making the data accessible to clients 528 on external networks, as described above.

In a further embodiment, the server disposed on the internal network communicates or transfers the data from the IEDs to clients 528 on the external network on the other side of the firewall 518, without the need to transfer or pass data to a server on the external network.

In another embodiment, each IED 510, 512, 514 may be configured to act as a server to perform the functionality described above obviating the need for a separate server.

Furthermore, in another embodiment, each IED 510, 512, 514 and each client device 528 may be configured as a server to create a peer-to-peer network, token ring or a combination of any such topology.

The systems and methods of the present disclosure may utilize one or more protocols and/or communication techniques including, but not limited to, e-mail, File Transfer Protocol (FTP), HTTP tunneling, SNTP trap, MSN, messenger, IRQ, Twitter™, Bulletin Board System (BBS), forums, Universal Plug and Play (UPnP), User Datagram Protocol (UDP) broadcast, UDP unicast, Virtual Private Networks (VPN), etc. Common chat protocols, such as MSN, AIM, IRQ, IRC, and Skype, could be used to send a message, containing the meter's data, to a public chat server which could then route that message to any desired client. A public social server that supports a common web interface for posting information, such as Twitter™, Facebook™, BBS's, could be used to post a status, containing the meter's data, to a user on the public social server for that service, e.g., server 440, 540, 640. This post could then be viewed by the clients to see the meter's data, or read by another server for further parsing and presentation. Hosted data services, such as a hosted database, cloud data storage, Drop-Box, or web service hosting, could be used as an external server to store the meter's data, called Hosting. Each of these Hosts, e.g., server 540, could then be accessed by the clients to query the Hosted Data.

In another embodiment, the IEDs can communicate to devices using Generic Object Oriented Substation Event (GOOSE) messages, as defined by the IEC-61850 standard, the content of which are herein incorporated by reference. A GOOSE message is a user-defined set of data that is "published" on detection of a change in any of the contained data items sensed or calculated by the IED. Any IED or device on the LAN or network that is interested in the published data can "subscribe" to the publisher's GOOSE message and subsequently use any of the data items in the message as desired. As such, GOOSE is known as a Publish-Subscribe message. With binary values, change detect is a False-to-True or True-to-False transition. With analog measurements, IEC61850 defines a "deadband" whereby if the analog value changes greater than the deadband value, a GOOSE message with the changed analog value is sent. In situation where changes of state are infrequent, a "keep alive" message is periodically sent by the publisher to detect a potential failure. In the keepalive message, there is a data item that indicates "The NEXT GOOSE will be sent in XX Seconds" (where XX is a userdefinable time). If the subscriber fails to receive a message in the specified time frame, it can set an alarm to indicate either a failure of the publisher or the communication network.

The GOOSE message obtains high-performance by creating a mapping of the transmitted information directly onto an Ethernet data frame. There is no Internet Protocol (IP) address and no Transmission Control Protocol (TCP). For delivery of the GOOSE message, an Ethernet address known as a Multicast address is used. A Multicast address is normally delivered to all devices on a Local Area Network (LAN). Many times, the message is only meant for a few devices and doesn't need to be delivered to all devices on the LAN. To minimize Ethernet traffic, the concept of a "Virtual" LAN or VLAN is employed. To meet the reliability criteria of the IEC-61850, the GOOSE protocol automatically repeats messages several times without being asked. As such, if the first GOOSE message gets lost (corrupted), there is a very high probability that the next message or the next or the next will be properly received.

In one embodiment, a client device, e.g., client computer 528, may include a suite of software utilities or a module for verifying the setup of an IED or meter. The meter setup verification feature provides a user with a list of possible problems detected with meters and the system, so that the user may identify and correct faults quickly and easily.

Figure 6:
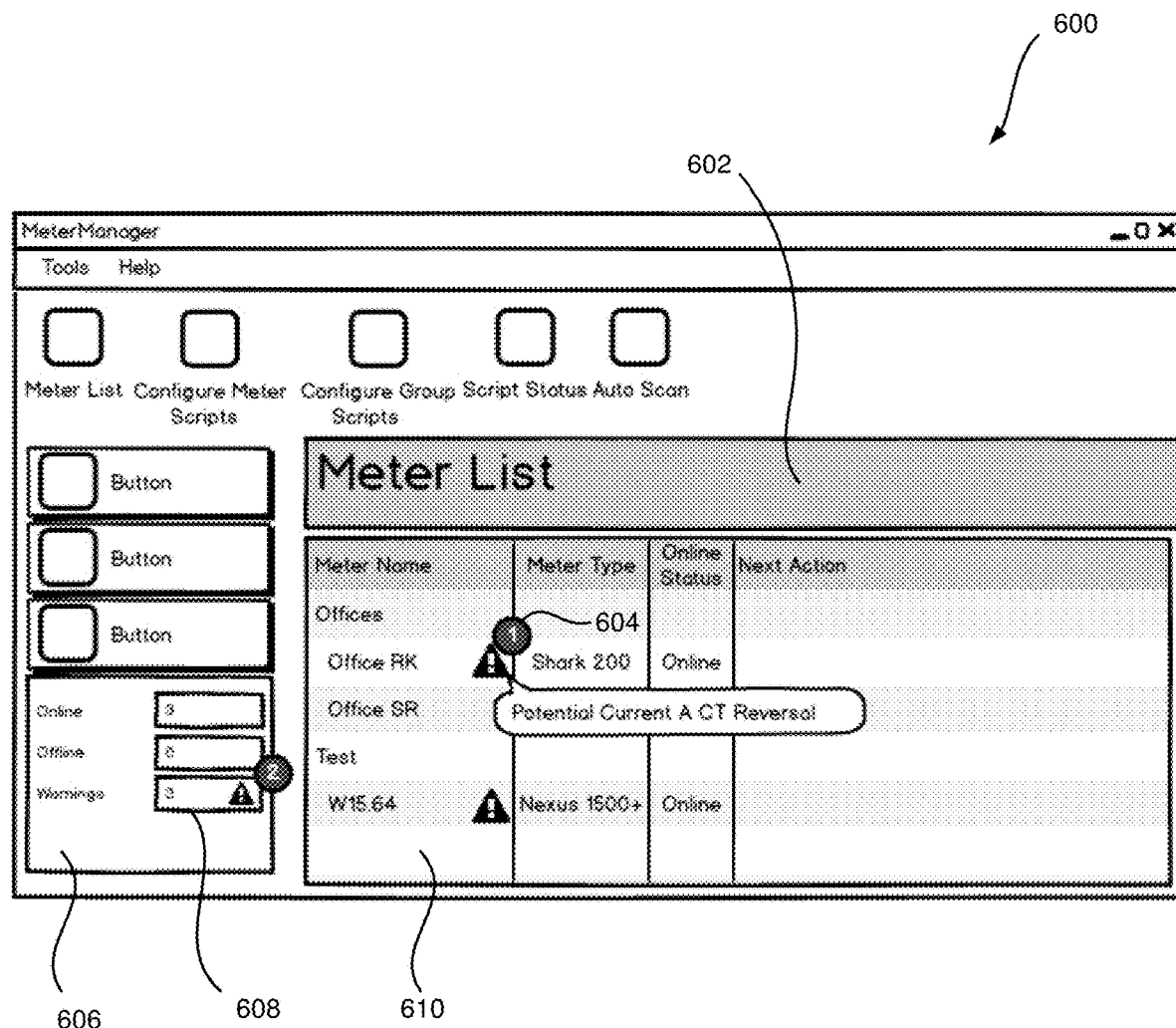
FIG. 6 is a screen shot illustrating a meter list indicating issues associated to each meter in accordance with an embodiment of the present disclosure.

In one embodiment, a utility or module is provided for setup verifications. For example, the software utility or module may perform a wiring check, i.e., verifies the voltage and current hookups are in the correct order and that the current transformers (CT's) are not reversed. Referring to FIG. 6, a screen shot 600 generated by the utility or module illustrates a meter list 602 for a plurality of meters, that may be on a single network or may be owned or associated to a single utility or organization over several networks. The meter list 602 includes at least two elements, to indicate to the user that a possible problem has been detected with one of the meters, or with the system. The meter list 602 displays a warning icon 604 next to the meter name when an issue with that meter is detected, and a status bar panel 606 includes a warnings item 608 to indicate a number of issues and/or warnings identified.

Figure 7:
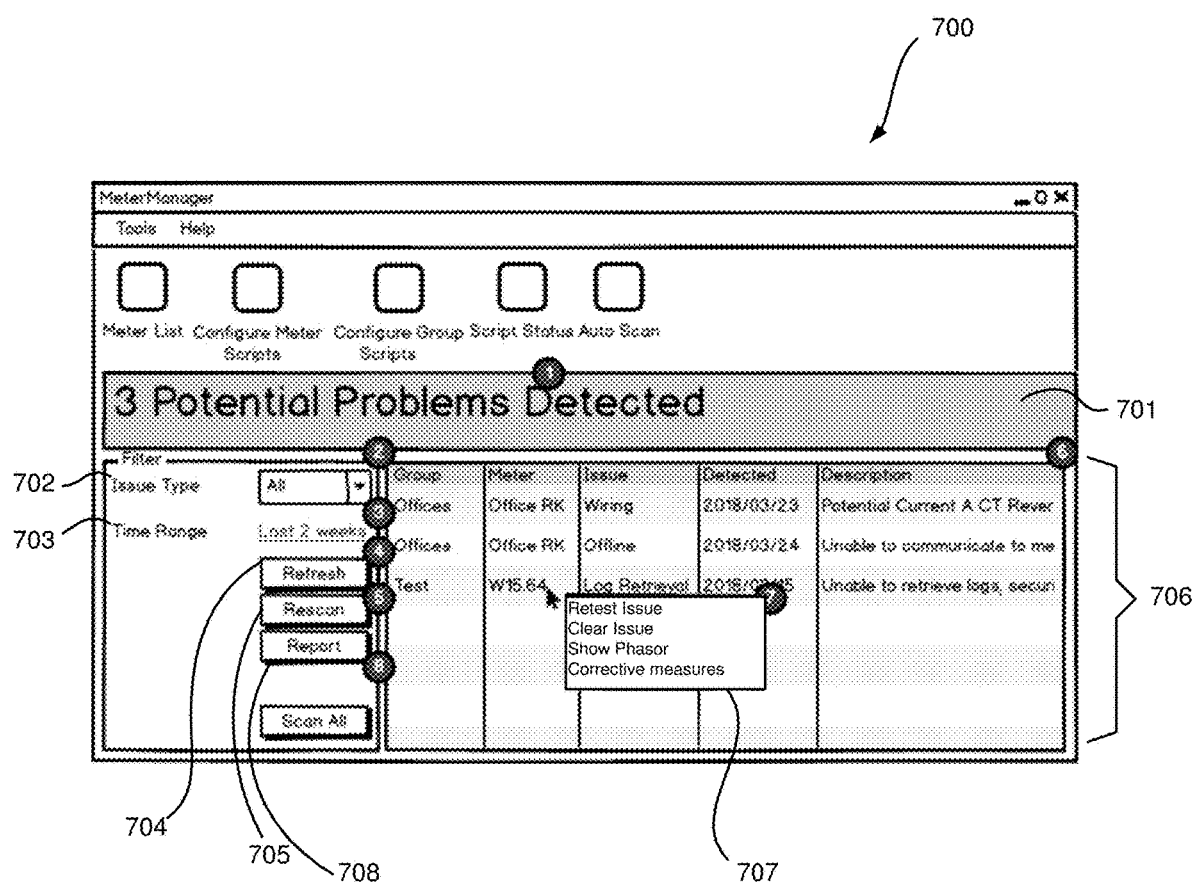
FIG. 7 is a screen shot illustrating a problem list displaying registered issues detected by the methods in accordance with an embodiment of the present disclosure.

The meter list warning icon 604 is displayed in a meter name column 610 when an issue with that meter is detected. Clicking the icon 604 jumps to a problems list panel, which will be described below in relation to FIG. 7. Hovering over the icon 604 lists the known issues, e.g., Potential Current A CT Reversal. Additionally, the status bar warnings item 608 lists the number of issues detected by the system, including both meter and system issues. Clicking the warnings item 608 jumps to the problems list panel, as illustrated in FIG. 7.

Figure 8:
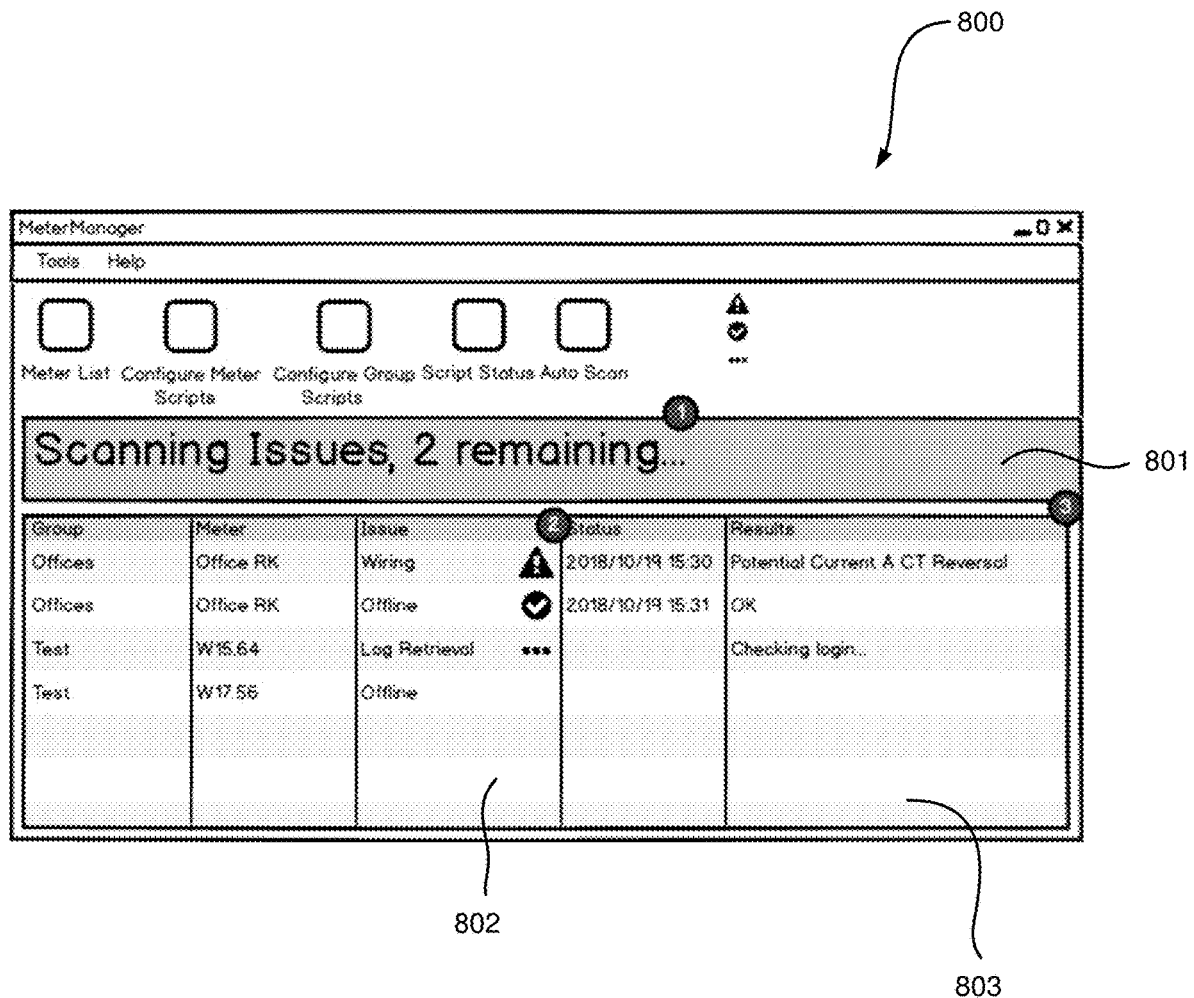
FIG. 8 is a screen shot illustrating a problem scan panel in accordance with an embodiment of the present disclosure.

The problems list panel 700 displays all of the registered issues detected by the utility or module and provides the user with the ability to search and filter the issues, and instruct the utility or module to retest each of the issues. In one embodiment, the problems list panel 700 is only shown when the system isn't scanning for problems; when the system is scanning for problems, the problems scan panel 800 (as shown in FIG. 8) is shown instead. Once loaded, the user interface (UI) shown in FIG. 7 may be refreshed on a periodic interval, e.g., a user defined predetermined interval, or reloaded when a refresh button is pressed. Individual elements of problems list panel 700 are described below:

Banner 701—Displays the number of problems detected, or No Problems Detected if there are none registered or detected.

Issue Type Filter 702—Allows the user to filter by different issue types, e.g., wiring, offline, log retrieval, etc.

Time Range Filter 703—Limits the displayed issues to only those in the time range specified, based on the last detected date.

Refresh List 704—Upon selection, queries the issues list from the utility or module, and refreshes the issues list based on the filter options.

Rescan 705—Upon selection, instructs the utility or module to retest issues that it knows how to process.

Issues List 706—Displays the list of problems or issues, given the filters selected by the user. Note, there may be multiple rows for a single meter, if there are multiple issues detected. The Issues List 706 includes at least five columns of information as follows:

Group—The group the meter is assigned to.

Meter—The meter the problem is associated with.

Issue—The category of problem detected, e.g., wiring, offline, log retrieval, etc.

Detected—When the issue was last detected or confirmed.

Description—Description of the problem, e.g., Potential Current A CT Reversal, unable to communicate to meter, unable to retrieve logs, etc.

Issue Actions 707—Right clicking on a problem in the issues list 706 brings up a menu of actions to perform on the problem. For example:

Retest Issue—Instructs the utility or module to retest the specific issue, and update its status.

Clear Issue—Removes the issue from the list of problems. If the problem is detected again, it will be reinserted to the list.

Show Phasor—Displays a live diagram of the current state of the phasors being monitored by the meter. Exemplary phasor diagrams are described and illustrated below in FIGS. 12 and 14.

Corrective Measures—Provides executable instructions to the meter/IED to rectify the incorrect wiring, e.g., by reassigning actual connections to the meter/IED to the proper expected value.

Report 708—Upon selection, generates a CSV report of the issues list, that can be given to a technician for service. An exemplary report is shown below:

| Meter | Serial | Connection | Issue | Description |
|---|---|---|---|---|
| Office RK | 0123456789 | mn://172.20.166.98 | Wiring | Potential Current A CT Reversal |
| W15.64 | 0123456788 | mn://172.20.166.99 | Offline | Unable to communicate to meter |

When the utility or module is scanning for problems, the problems list panel 700 displays the problem scan panel 800 instead, as shown in FIG. 8. The problem scan panel 800 displays a list of each known problem, and the current status of its check. Once the scan has completed, the panel automatically reverts to the problems list panel 700. Using a periodic status query, the current status and list are updated by a user adjustable period, e.g., every couple of seconds. Individual elements of problems scanning panel 800 are described below:

Banner 801—The banner changes to indicate that the utility or module is checking problems and how many issues/problems remain to be tested.

Issue/Status 802—Displays the current status of each problem being tested. For example, ⚠ Possible Problem—The issue is still a problem after the test.

✅ Resolved—The issue was resolved, and will be removed from the problems list.

✱✱✱ Testing—The utility or module is currently testing the problem.

Pending—The utility or module has not yet retested the problem.

Results 803—Displays the results of the test, or the current actions being performed for the test.

It is to be appreciated that some issues, such as log retrieval and connection issues, are incidentally detected through the normal operation of the utility or module. When these issues are detected, they can be reported through various methods such as email, an API, etc. Some issues, such as the wiring check, may only ever need to be checked on demand, or periodically. An on-demand testing service can be run from a predefined script to perform this, and the issue retesting functionality. This service may be a thread that is run on demand via RPC (Remote Procedure Call), as opposed to a script.

The client device may store the meter data generated in a storage device disposed in or coupled to the client device. In one exemplary embodiment, the stored data may have the following structure:

Type—The type (or category) of the problem.

Wiring

Offline

Log Retrieval

Meter—The device key for the meter. Note, the display name or group is not stored, as that can change, and should be handled by the user interface (UI).

Detected Date—The date the problem was last detected or updated.

Description—A text description of the possible problem, to be displayed to the user, and providing more information than just the type.

In one embodiment, the problems list may be stored as an XML structure. An exemplary problems list stored as an XML structure is illustrated below, which includes "issue type", "meter", "detected_date" and "desc" for description as described above:

```
<root>
    <header version="1" last_updated="2018/03/25 12:15:17"/>
    <issues>
        <issue type="wiring" meter="0091234567"
        detected_date="2018/03/23 17:18:13"
  desc="Potential Current A CT Reversal"/>
        <issue type="offline" meter="0091234567"
        detected_date="2018/03/24 23:57:01"
  desc="Unable to communicate to meter"/>
        <issue type="log retrieval" meter="0000000012345678"
        detected_date="2018/03/15
12:12:03" desc="Unable to retrieve logs, security required but not configured"/>
    </issues>
</root>
```

A RPC may be employed to query issues, for example:

issues.list

This text is an example (and could be arbitrary), and other commands which execute similar code are envisioned.

The RPC queries a list of all the issues detected by the meter setup verification utility or module. If the utility or module is currently retesting the problems list, this command will return that status.

When tests are not running:

```
<root>
    <header version="1" last_updated="2018/03/25 12:15:17"
    status="ready"/>
    <issues>
        <issue type="wiring" meter="0091234567"
        detected_date="2018/03/23 17:18:13"
  desc="Current CT's Reversed"/>
        <issue type="offline" meter="0091234567"
        detected_date="2018/03/24 23:57:01"
  desc="Unable to communicate to meter"/>
        <issue type="log retrieval" meter="0000000012345678"
        detected_date="2018/03/15
12:12:03" desc="Unable to retrieve logs, security required but not
```

-continued

```
            configured"/>
        </issues>
</root>
```

When tests are running:

```
<root>
    <header version="1" last_updated="2018/03/25 12:15:17"/
        status="testing">
        <issues>
            <issue type="wiring" meter="0091234567"
            detected_date="2018/03/23 17:18:13"
status="problem" desc="Current CT's Reversed"/>
            <issue type="offline" meter="0091234567"
            detected_date="2018/03/24 23:57:01"
status="ok" desc="Able to connect"/>
            <issue type="log retrieval" meter="0000000012345678"
            detected_date="2018/03/15
12:12:03" status="pending" desc="Attempting to login..."/>
        </issues>
</root>
```

As described above, issues may be retested from the problems list panel 700. Right clicking on a problem in the issues list 706 brings up a menu of actions to perform on the problem, i.e., issue actions 707. Selecting "Retest Issue", instructs the utility or module to retest a specific issue, or all the issues, according to the command below.

```
issues.test [meter] [type]
issues.test "meter=0091234567,type=wiring"
```

Issuing this command will prevent querying the issues list until completed.

[meter]—The meter to retest. If not specified, issues for all meters will be retested.

[type]—The type of issues to retest. If not specified, all types of issues are retested (as available).

Other command formats are envisioned, such as separate commands to test all meters, a list of meters, and a single meter.

Figure 16:
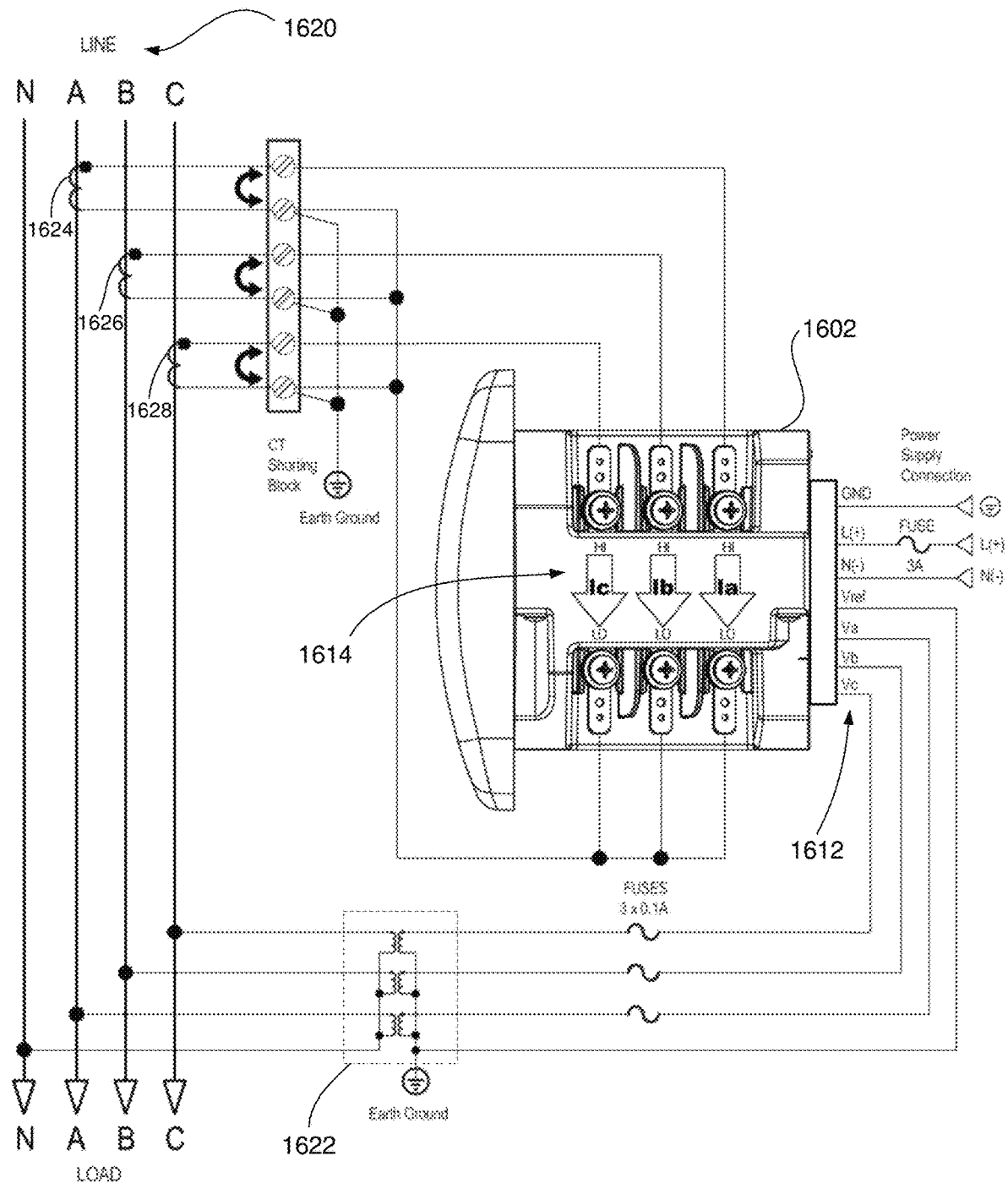
FIG. 16 is an exemplary wiring diagram of an electronic power meter in a 3 element Wye configuration in accordance with an embodiment of the present disclosure.

When a meter has been hooked up to the electrical power distribution system in a 3 Element Wye or 2 CT Delta configuration, the utility or module may use voltage and current phase angles as determined by the meter to determine if the meter has been wired incorrectly. Referring to FIG. 16, an exemplary wiring diagram of an electronic power meter 1602 in a 3 Element Wye configuration is provided. The meter 1602 includes voltage inputs 1612 (e.g., Va, Vb, Vc, Vref) and current inputs 1614 (e.g., Ia, Ib, Ic). Each voltage input is coupled to a respective line 1620 of the electrical distribution system, e.g., input Va is coupled to line or phase A, input Vb is coupled to line or phase B, input Vc is coupled to line or phase C and input Vref is coupled to line or phase N (neutral). Each voltage input 1612 may be connected directly to a respective line or phase, or alternatively, each voltage input 1612 may be coupled to a respective line or phase via an optional potential transformer 1622. Each current input 1614 is coupled to a respective line 1620 of the electrical distribution system via a current transformer (CT) 1624, 1626, 1628. As can be seen in FIG. 16, each current input for a respective line or phase includes a HI input and a LO input.

Figure 17:
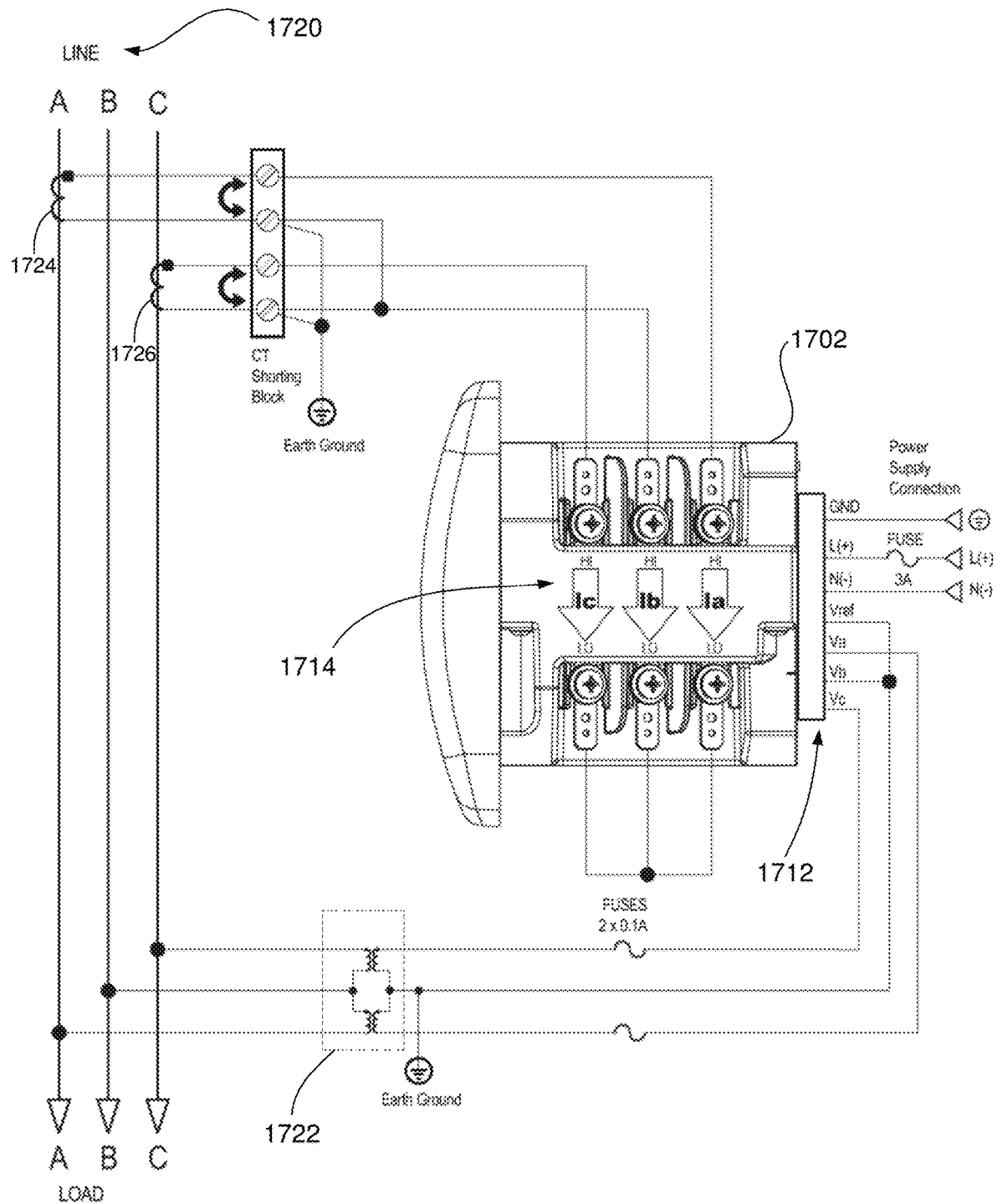
FIG. 17 is an exemplary wiring diagram of an electronic power meter in a 2 CT Delta configuration in accordance with an embodiment of the present disclosure.

Referring to FIG. 17, an exemplary wiring diagram of an electronic power meter 1702 in a 2 CT Delta configuration is provided. The meter 1702 includes voltage inputs 1712 (e.g., Va, Vb, Vc, Vref) and current inputs 1714 (e.g., Ia, Ib, Ic). Each voltage input is coupled to a respective line 1720 of the electrical distribution system, e.g., input Va is coupled to line or phase A, input Vb is coupled to line or phase B, and input Vc is coupled to line or phase C. Each voltage input 1612 may be connected directly to a respective line or phase, or alternatively, the voltage inputs 1612 may be coupled to the three lines or phases via two optional potential transformers 1722. The current inputs 1714 are coupled to three lines or phases 1720 of the electrical distribution system via two current transformers (CTs) 1724 and 1726. As can be seen in FIG. 17, each current input for a respective line or phase includes a HI input and a LO input.

Since a result that the meter has been wired incorrectly will not change until rectified (e.g., a technician has rewired the meter, a user initiated reprogramming based on the actual wiring has been implemented, etc.), and will not become incorrect again after it has been rectified, this verification can be done on an as needed basis. For example, often a meter is first installed by a contractor or electrician, that may not have the ability or knowledge to verify that the voltage and current has been wired up correctly. This is particularly troublesome when phases are connected in the wrong order, as the raw voltage and current may look normal, but the energy accumulated and the phase angles reported, may be completely wrong. By checking and reporting the meter hookup issues, an administrator can quickly check the wiring of the meters in the associated system, and send technicians out with specific instructions to repair.

Figure 9:
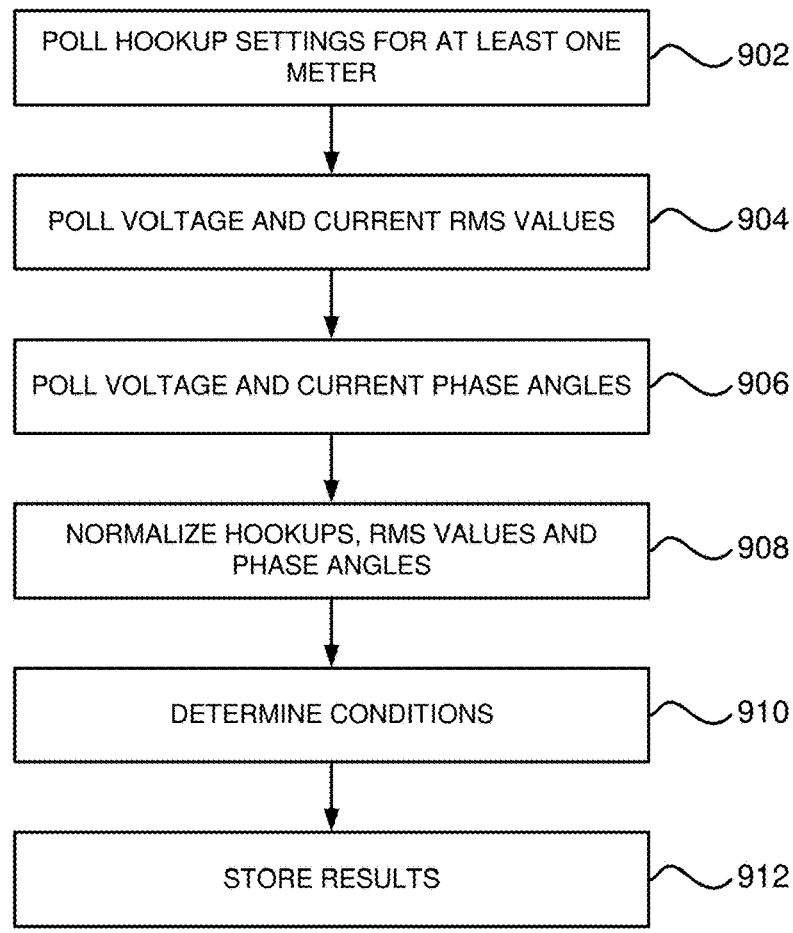
FIG. 9 is a flow chart illustrating a method for verifying a meter setup in accordance with an embodiment of the present disclosure.

Referring to FIG. 9, a method for verifying a meter setup is provided. It is to be appreciated that the method of FIG. 9 may be performed by a client device including the software utility or module of the present disclosure, such as client device 528 described above. In step 902, the client device polls hookup or configuration settings for the meter or meters, e.g., 3 Element Wye or 2 CT Delta. It is to be appreciated that the hookup or configuration setting may be initially selected via a user interface on a display device of the meter (e.g., via display 206 and buttons 210 of meter 200 as in FIGS. 2A and 2B) or via a software program running on a client device coupled to the meter. The selected hookup or configuration setting may then be stored in a memory of the meter. Next, in step 904, voltage and current RMS values are polled. The voltage and current phase angles are polled, in step 906.

Figure 10:
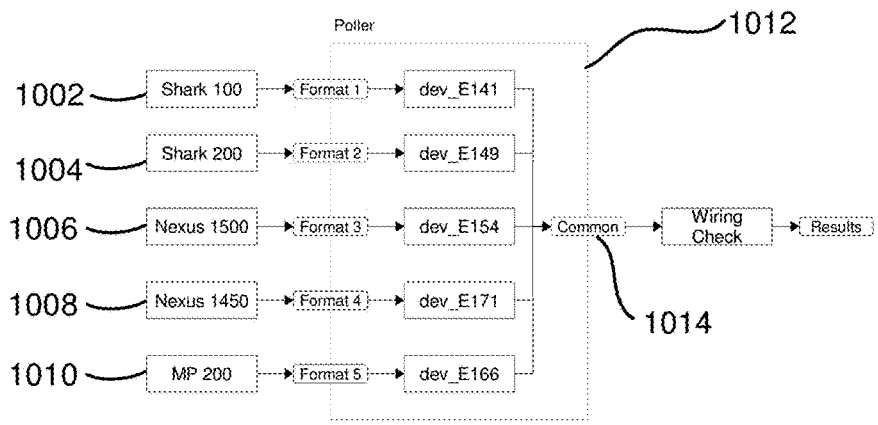
FIG. 10 is a block diagram of a device for performing a meter setup verification or wiring check that normalizes the format of data received from different types of meters in accordance with an embodiment of the present disclosure.

In step 908, the hookup settings, RMS values, and phase angles are normalized. Because each meter type may return phase angles and hookup or configuration settings in different formats, in one embodiment, the client device uses a DeviceLib class for each meter, i.e., a library module customized for each meter type, to individually translate the meters phase angle format to one useable by the wiring check utility or module. Referring to FIG. 10, five meter types 1002, 1004, 1006, 1008, 1010 are in communication and polled for data to perform the wiring check. Each of the five meters 1002, 1004, 1006, 1008, 1010 have a different, predefined phase angle or data format, i.e., format 1, format 2, format 3, respectively. A poller 1012 in the client device employs a DeviceLib class for each meter to individually translate the phase angle format of each meter to a common format 1014.

Using the common phase angle format output by DeviceLib, the wiring check utility or module applies the various tests (as will be described below) to generate a result for each meter tested, in step 910. These results are then stored in the problems list table, in step 912.

Before conducting a wiring check, the utility or module verifies at least three conditions. Initially, the utility or module determines if the wiring configuration setup programmed into the meter is a 3 Element Wye or a 2 CT Delta. It is to be appreciated that the wiring configuration setup may be selectable from a user interface coupled to the meter, e.g., a display device on the meter, via a software program executing on the client device, etc., and stored in memory of the meter. Depending on the wiring configuration, the utility or module performs different checks or tests to determine if the wiring setup is correct. Additionally, the utility or module determines if the RMS voltage is above 5 V secondary and RMS current is above 0.05 A secondary.

Figure 11:
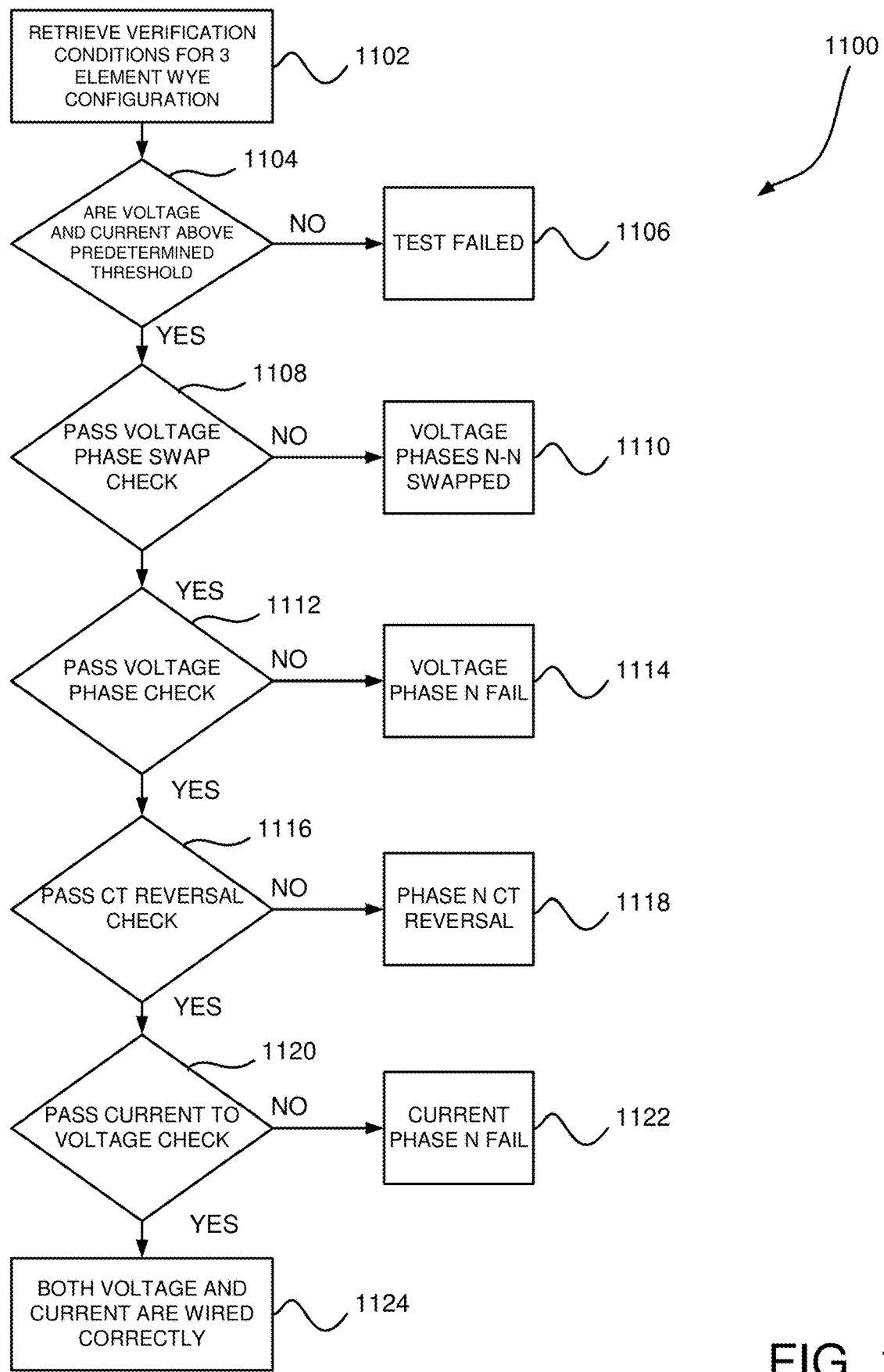
FIG. 11 is a flow chart illustrating a method for verifying a meter setup in a 3 Element Wye configuration in accordance with an embodiment of the present disclosure.

Referring to FIG. 11, a method 1100 for verifying the wiring setup of a meter in a 3 Element Wye configuration is provided. It is to be appreciated that the method of FIG. 11 may be performed by a client device including the software utility or module of the present disclosure, such as client device 528 described above. It is to be appreciated that the tests or checks performed in FIG. 11 are the tests referred to in step 910 of FIG. 9. Initially, in step 1102, if it is determined that the meter is configured in a 3 Element Wye configuration, the tests or checks for the 3 Element Wye configuration are retrieved, e.g., from a memory device. In step 1104, RMS voltage and current (that were retrieved in step 904 of FIG. 9) are analyzed to determine if they are above a predetermined threshold, e.g., voltage is above 5 V secondary and current is above 0.05 A secondary. If the voltage and current are below the respective predetermined threshold, the test fails, in step 1106, and method 1100 stops where no further tests or checks are performed. If the voltage and current are above the respective predetermined threshold, method 1100 proceeds to step 1108.

In step 1108, the utility or module determines if the voltage phases are swapped, e.g., if all of the current phases are within ±45 degrees of a voltage, but two of the currents are associated with the wrong voltage. If the voltage phases are swapped, the test fails, in step 1110, and method 1100 stops where no further tests or checks are performed; otherwise, method 1100 proceeds to step 1112. Note, this test need not be performed if one of the current phase RMS values are below the threshold, as the relative phase angle between the current and voltage may be unreliable.

In step 1112, a voltage phase check is preformed, e.g., it is determined if the voltage phases are 120 degrees+/−5 degrees apart. If the voltage phases are not in compliance, the test fails, in step 1114, and method 1100 stops where no further tests or checks are performed; otherwise, if all three voltage phases are 120 degrees+/−5 degrees apart, method 1100 proceeds to step 1116.

In step 1116, a CT reversal check is preformed, e.g., it is determined that a current phase is 180 degrees+/−45 degrees from a corresponding voltage. If the currents are associated with the wrong voltage phases, the test fails, in step 1118, and method 1100 stops where no further tests or checks are performed; otherwise, method 1100 proceeds to step 1120.

In step 1120, a current to voltage check is preformed, e.g., it is determined if each current phase is +/−45 degree from a corresponding voltage. If a respective current phase is greater than +/−45 degree from a corresponding voltage phases (e.g., if Ia is greater than +/−45 degrees from Va), the test fails, in step 1122, and method 1100 stops where no further tests or checks are performed; otherwise, method 1100 determines both voltage and current are wired correctly, in step 1124.

In one embodiment, if the voltages are above the predetermined voltage threshold, but the currents are below the predetermined current threshold in step 1104, the voltage tests or checks, e.g., steps 1108 and 1112, may still be performed without performing the current tests or checks, e.g., steps 1116 and 1120. In another embodiment, if the voltages are above the predetermined voltage threshold, but only certain currents are above the predetermined current threshold (e.g., only the current for phase A is above the predetermined current threshold), the current tests or checks may be performed on those individual current phases that have current values above the predetermined current threshold, in addition to the voltage checks being performed.

It is to be appreciated that in certain embodiments all steps, tests and/or checks, e.g., steps 1104, 1108, 1112, 1116, 1120, may be performed even if one or more tests and/or checks have failed. In other embodiments, the steps, tests and/or checks may be performed in any order or simultaneously. For example, after each test, a flag may be set indicating if a particular test has passed or failed. After all test are completed, an indication may be presented indicating at least one test has failed and/or the indication may present a list of which tests have failed.

Figure 12:
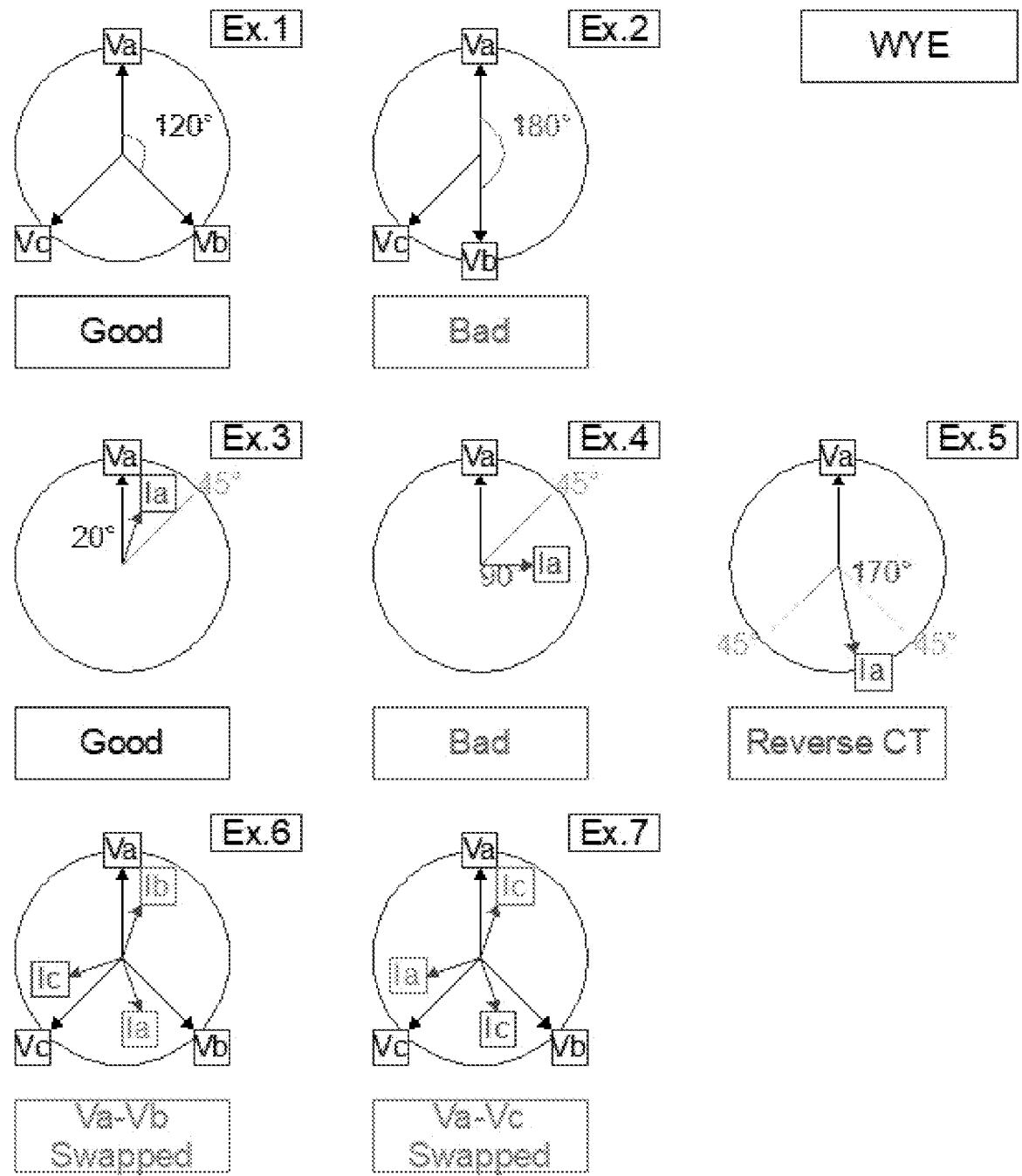
FIG. 12 illustrates various phasor diagrams illustrating exemplary results of the methods in accordance with the present discourse.

Referring to FIG. 12, exemplary results of the analysis performed in method 1100 for a 3 Element Wye configuration are illustrated in the various phasor diagrams. The results of the voltage phase check of step 1112, where voltage phases must be 120 degrees±5 degrees apart, are illustrated in Examples 1 and 2 of FIG. 12. Example 1 shows the ideal (or passing) case where voltage phases Va, Vb and Vc are 120 degrees apart. Example 2 shows a failing case, where at least the voltage phase between Va and Vb is 180 degrees apart (i.e., more than 120 degree apart). The results of the current phase check of step 1120, where current phase must be within ±45 degrees of its corresponding voltage phase, is illustrated in Examples 3 and 4 of FIG. 12. Example 3 shows the ideal or passing case where Ia is approximately 20 degrees from Va, and Example 4 shows a failing case where current Ia is more than 45 degrees from voltage Va, i.e., in this example, Ia is 90 degrees from Va.

If the current phase is 180 degrees±45 degrees of the voltage phase as determined in step 1116, this indicates a reversed CT. Example 5 of FIG. 12 shows this failing case, where current Ia is approximately 170 degrees from Va. Step 1108 determines if the voltage phases are swapped by determining if all of the current phases are within ±45 degrees of a voltage, but two of the currents are associated with the wrong voltage. Example 6 of FIG. 12 shows a case where Va and Vb are swapped, as shown by the fact that the Ib angle matches the Va angle, Ia matches the Vb angle, and Ic matches the Vc angle. Similarly, Example 7 of FIG. 12 shows a case where Va and Vc are swapped.

Figure 13:
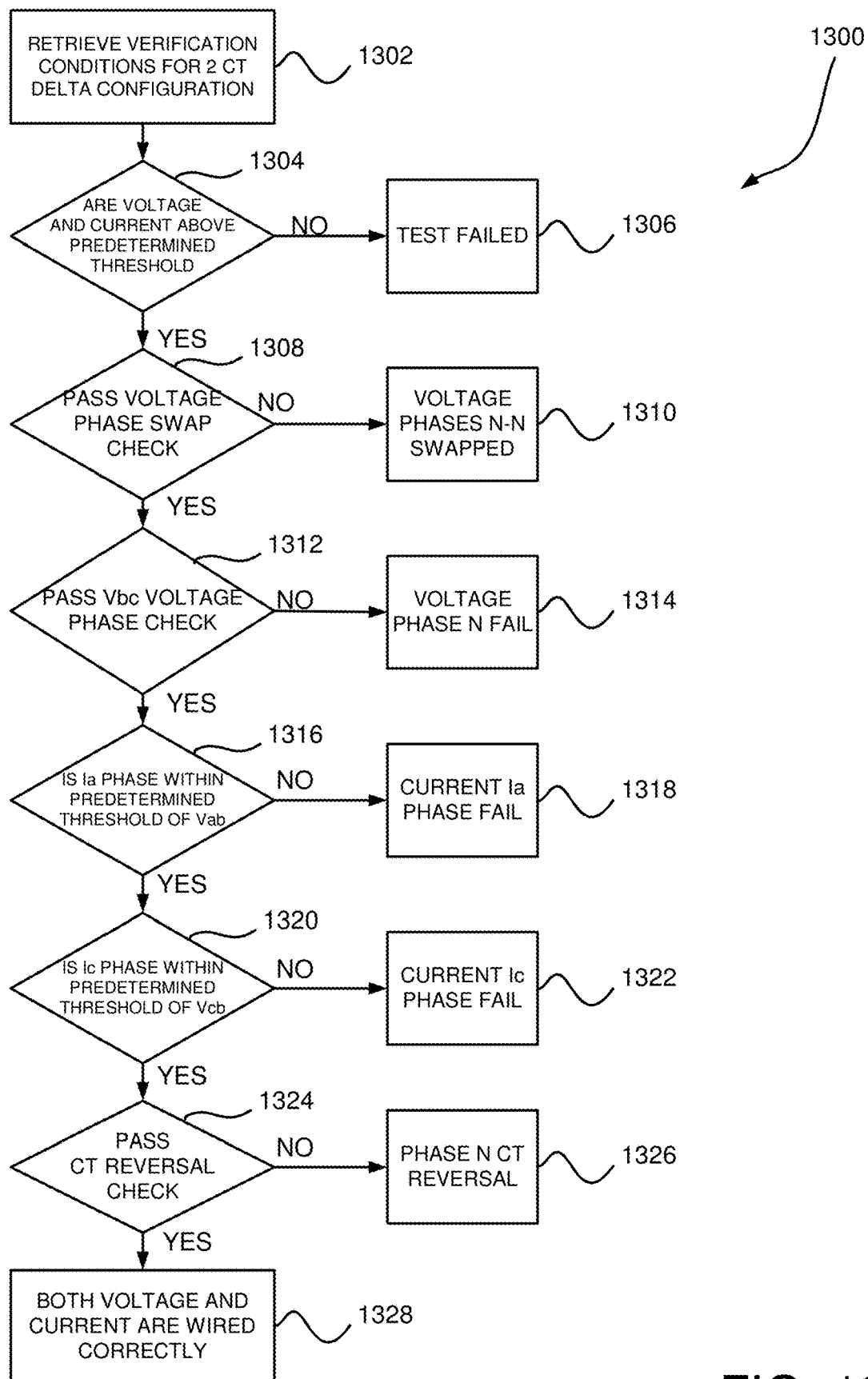
FIG. 13 is a flow chart illustrating a method for verifying a meter setup in a 2 CT Delta configuration in accordance with an embodiment of the present disclosure.

Referring to FIG. 13, a method 1300 for verifying the wiring setup of a meter in a 2 CT Delta configuration is provided. It is to be appreciated that the method of FIG. 13 may be performed by a client device including the software utility or module of the present disclosure, such as client device 528 described above. It is to be appreciated that the tests or checks performed in FIG. 13 are the tests referred to in step 910 of FIG. 9. Initially, in step 1302, if it is determined that the meter is configured in a 2 CT Delta configuration, the tests or checks for the 2 CT Delta configuration are retrieved. In step 1304, RMS voltage and current (that were retrieved in step 904 of FIG. 9) are analyzed to determine if they are above a predetermined threshold, e.g., voltage is above 5 V secondary and current is above 0.05 A secondary. If the voltage and current are below the respective predetermined threshold, the test fails, in step 1306, and method 1300 stops where no further tests or checks are performed. If the voltage and current are above the respective predetermined threshold, method 1300 proceeds to step 1308. In step 1308, the utility or module determines if the voltage phases are swapped. If the voltage phases are swapped, the test fails, in step 1310, and method 1300 stops where no further tests or checks are performed; otherwise, method 1300 proceeds to step 1312.

In step 1312, a Vbc voltage phase check is preformed, e.g., it is determined if the Vcb voltage phase is 60 degrees+/−5 degrees from the Vab phase. If the voltage phases are not in compliance, the test fails, in step 1314, and method 1300 stops where no further tests or checks are performed; otherwise, method 1300 proceeds to step 1316.

In step 1316, a check is preformed to determine if Ia phase is within a predetermined threshold of Vab phase, e.g., it is determined if the Ia current phase is 30 degrees+/−45 degrees from the Vab phase. If the Ia current phase is not in compliance, the test fails, in step 1318, and method 1300 stops where no further tests or checks are performed; otherwise, method 1300 proceeds to step 1320.

In step 1320, a check is preformed to determine if Ic phase is within a predetermined threshold of Vcb phase, e.g., it is determined if the Ic current phase is 30 degrees+/−45 degrees from the Vcb phase. If the Ic current phase is not in compliance, the test fails, in step 1322, and method 1300 stops where no further tests or checks are performed; otherwise, method 1300 proceeds to step 1324.

Figure 14:
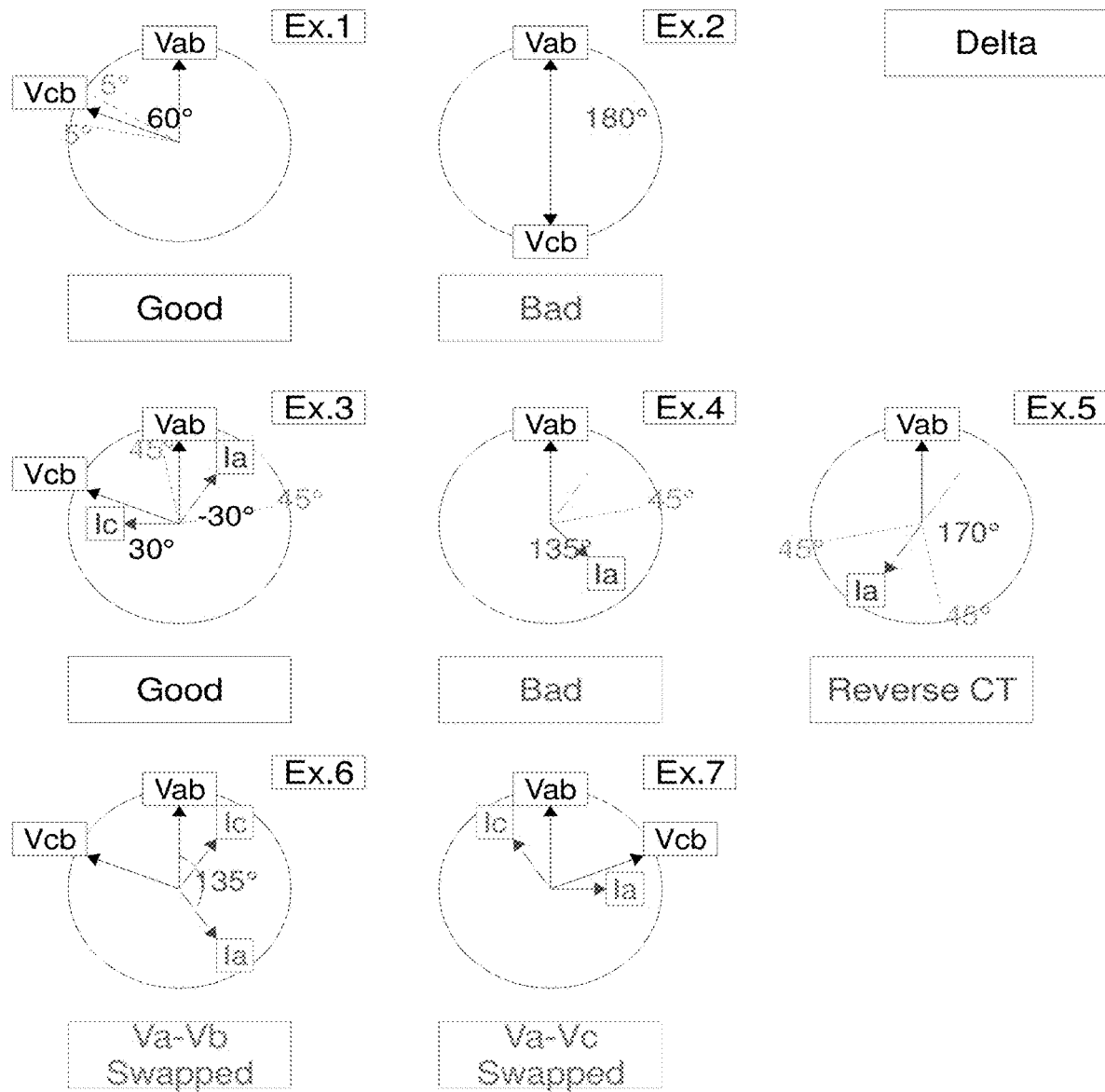
FIG. 14 illustrates various phasor diagrams illustrating exemplary results of the methods in accordance with the present discourse.

In step 1324, a CT reversal check is preformed, e.g., it is determined that a current phase is 180 degrees+/−45 degrees from the ideal (where the current angles should be in a perfect system, i.e., see FIG. 14, Example 3). If the currents are reversed, the test fails, in step 1326, and method 1300 stops where no further tests or checks are performed; otherwise, method 1300 determines the CTs are wired correctly, in step 1324.

In one embodiment, if the voltages are above the predetermined voltage threshold, but the currents are below the predetermined current threshold in step 1304, the voltage tests or checks, e.g., steps 1308 and 1312, may still be performed without performing the current tests or checks, e.g., steps 1316, 1320 and 1324. In another embodiment, if the voltages are above the predetermined voltage threshold, but only certain currents are above the predetermined current threshold (e.g., only the current for phase A is above the predetermined current threshold), the current tests or checks may be performed on those individual current phases that have current values above the predetermined current threshold, in addition to the voltage checks being performed.

It is to be appreciated that in certain embodiments all steps, tests and/or checks, e.g., steps 1304, 1308, 1312, 1316, 1320, 1324, may be performed even if one or more tests and/or checks have failed. In other embodiments, the steps, tests and/or checks may be performed in any order or simultaneously. For example, after each test, a flag may be set indicating if a particular test has passed or failed. After all test are completed, an indication may be presented indicating at least one test has failed and/or the indication may present a list of which tests have failed.

Referring to FIG. 14, exemplary results of the analysis performed in method 1300 for a 2 CT Delta configuration are illustrated in the various phasor diagrams. The results of the Vbc voltage phase check of step 1312, where Vcb must be 60 degrees±5 degrees from the Vab phase, are illustrated in Examples 1 and 2 of FIG. 14. Example 1 shows the ideal case, where Vab is 60 degrees+/−5 degrees from Vcb, and Example 2 shows a failing case, where Vab is 180 degrees from Vcb. The results of the checks performed in steps 1316 and 1320, where Ic phase must be +30 degrees±45 degrees from Vcb, and Ia must be −30 degrees±45 degrees from Vab, are illustrated in Examples 3 and 4 of FIG. 13. Example 3 shows the ideal case where Ic is within 30 degrees of Vcb and Ia is within −30 degrees of Vab, and Example 4 shows a failing case where Ia is approximately 135 degrees from Vab.

If the current phase is 180 degrees±45 degrees of the ideal (−30 degrees in the case of Ia), as determined in step 1324, this indicates a reverse CT, as illustrated in Example 5. The results of the voltage swap check of step 1308 are illustrated in Examples 6 and 7 of FIG. 14. If Ic is where Ia should be, and Ia is −135 degrees±45 degrees from Vab, this indicates that Va and Vb are swapped, as shown in Example 6 of FIG. 14. If Vcb is −60 degrees±5 degrees from Vab, Ia is −30 degrees±45 degrees from Vcb, and Ic is 30 degrees±45 degrees from Vab, this indicates that Va and Vc are swapped, as shown in Example 7 of FIG. 14.

Based on the results of the analysis above, the following messages or descriptions/meanings may be generated and displayed in the description section of the issues list 706 of FIG. 7:

| Message | Meaning |
| --- | --- |
| General ||
| OK | Both voltage and current are correctly wired. |
| Not supported | Supports 3 Element Wye and 2 CT Delta, only. |
| Unable to communicate with meter | Meter is offline. |
| Voltage Low - One or more of the voltage phases has too low of an RMS value. | Below 5 V secondary |
| Current Low - One or more of the current phases has too low of an RMS value. | Below 0.05 A secondary |
| Phase A CT Reversal - A current phase may be reversed. | Current phase 180° ± 45 of the voltage phase. |
| Phase B CT Reversal - B current phase may be reversed. | Current phase 180° ± 45 of the voltage phase. |
| Phase C CT Reversal - C current phase may be reversed. | Current phase 180° ± 45 of the voltage phase. |
| 3 Element Wye ||
| Voltage Phases Va and Vb may be swapped - Two of the voltage phases may | All Current phases ±45° from a voltage, but two of the currents are associated with the |

| Message | Meaning |
|---|---|
| be swapped. | wrong voltage. |
| Voltage Phases Va and Vc may be swapped - Two of the voltage phases may be swapped. | All Current phases ±45° from a voltage, but two of the currents are associated with the wrong voltage. |
| Current Out of Phase - The current phases may be incorrect. | Current phase ±45° from corresponding voltage. |
| Voltage Out of Phase - The voltage phases may be incorrect. | Voltage phase 120° ± 5 apart. |
| 2 CT Delta | |
| Voltage Phases A-C Swapped - Two of the voltage phases may be swapped. | Vab 60° ± 5 from Vcb |
| Voltage Phases B-C Swapped - Two of the voltage phases may be swapped. | Vcb 60° ± 5 from Vab |
| Voltage Phase C may be incorrect. | Vcb 60° ± 5 from Vab |
| Current Phase A Bad may be incorrect. | Ia must be −30° ± 45° from Vab |
| Current Phase C Bad may be incorrect. | Ic phase must be +30° ± 45° from Vcb. |

It is to be appreciated that based on the results of the wiring check, software utility or module (executed by at least one processor of the client device or by at least one processor of a meter) may trigger various events to occur. For example, the at least one processor may generate a notification indicating that the meter is wired incorrectly. In one embodiment, the notification may include a work order indicating the problem/issue and sent to the appropriate personnel to correct the issue, e.g., a field technician. The notification or work order may be sent via email, text message, computer-generated voice message, etc. without user intervention. The notification or work order may include information identifying the meter, its location, and/or corrective measures to rectify the incorrect wiring. In another embodiment, the wiring check utility or module may trigger an output on a respective meter having a wiring issue, for example, to trip a relay to shut off power being delivered to a load. Other outputs/triggers are contemplated to be within the scope of the present disclosure.

In another embodiment, the incorrect wiring setup may be rectified by reprogramming the meter. In one embodiment, if the at least one processor determines that the at least one electronic power meter is wired incorrectly, the at least one processor generates executable instructions to rectify the determined incorrect wiring of the at least one electronic power meter and transmits the executable instructions to the at least one electronic power via the communication interface without user intervention. In another embodiment, if the at least one processor determines that the at least one electronic power meter is wired incorrectly, the at least one processor prompts a user via a user interface to initiate corrective measures and, if the user activates the corrective measures via the user interface, the at least one processor generates executable instructions to rectify the determined incorrect wiring of the at least one electronic power meter and transmits the executable instructions to the at least one electronic power via the communication interface.

In one example, a CT may be reversed, i.e., the leads from the CT coupled to the HI and LO current inputs 1614 may be reversed. If it is determined that at least one CT is reversed, corrective measures may be initiated, either by the user or automatically by the software utility or module, and the meter's instructions (e.g., firmware, software, programmable settings, etc.) shifts the current phase by 180 degrees for that phase, rather than rewiring the meter. This will reverse the power direction, and all computations such as power factor, phase angle etc., which are derived after that will be affected. The option to rectify an incorrect wiring setup (or take corrective measures) may be presented to a user on a user interface of the client device, e.g., the problem list 700 shown in FIG. 7. Where upon selection, e.g., selection of "Corrective Measures" on issue actions 707, the corrective measures may be placed in effect. Alternatively, the corrective measures for a particular problem may be automatically implemented by at least one processor of the meter with user input or intervention. After the corrective measures have been implemented, a user may select "Retest Issue" on issue actions 707 to observe whether the corrective measures actually corrected the particular problem.

In another example, it may be determined that the voltages are swapped, as determined in step 1108 of method 1100 and shown in Ex. 6 of FIG. 12 where Va and Vb are swapped. Upon a user selecting corrective measures or the corrective measures being automatically initiated by the client device or meter, executable instructions will be implemented to now assigned the values as being read at voltage input Va as values for Vb and vice versa. After the corrective measures have been implemented, a user may select "Retest Issue" to observe whether the corrective measures actually corrected the particular problem (where, in this case, the problem is that Va and Vb were swapped).

Figure 15:
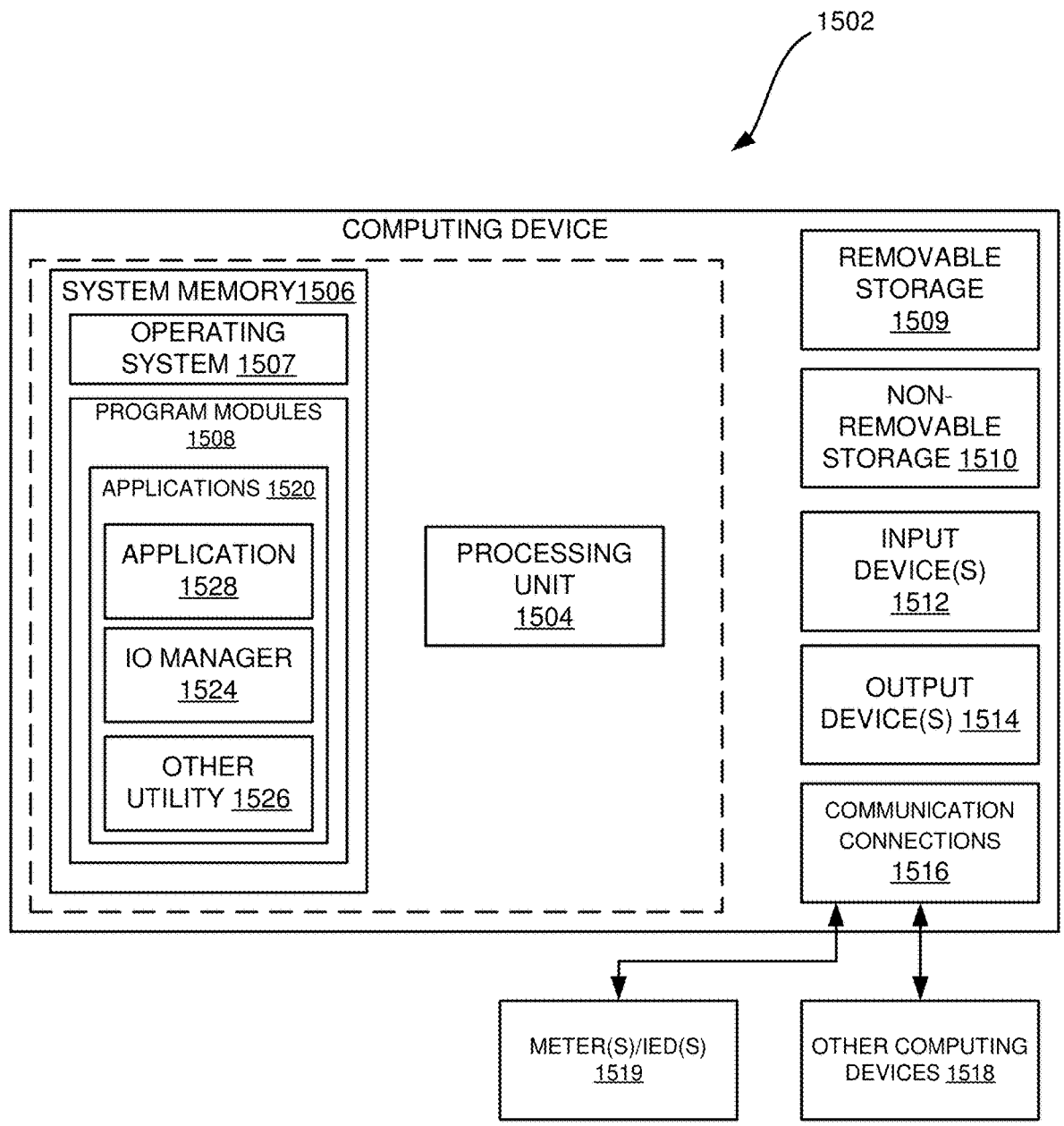
FIG. 15 is a block diagram of an exemplary computing device in accordance with an embodiment of the present disclosure.

FIG. 15 is a block diagram illustrating physical components of a computing device 1502, for example a client computing device, with which examples of the present disclosure may be practiced. Among other examples, computing device 1502 may be an exemplary computing device configured for execution of a wiring check module that is used to verify a meter wiring setup as described herein. In a basic configuration, the computing device 1502 may include at least one processing unit 1504 and a system memory 1506. Depending on the configuration and type of computing device, the system memory 1506 may comprise, but is not limited to, volatile storage (e.g., random access memory), non-volatile storage (e.g., read-only memory), flash memory, or any combination of such memories. The system memory 1506 may include an operating system (OS) 1507 and one or more program modules 1508 suitable for running software programs/modules 1520 such as IO manager 1524, other utility 1526 and application 1528, for example, the wiring setup verification utility. As examples, system memory 1506 may store instructions for execution. Other examples of system memory 1506 may store data associated with applications. The operating system 1507, for example, may be suitable for controlling the operation of the computing device 1502. Furthermore, examples of the present disclosure may be practiced in conjunction with a graphics library, other operating systems, or any other application program and is not limited to any particular application or system. This basic configuration is illustrated in FIG. 15 by those components within a dashed line 1522. The computing device 1502 may have additional features or functionality. For example, the computing device 1502 may also include additional data storage devices (removable and/or non-removable) such as, for example, magnetic disks, optical disks, or tape. Such additional storage is illustrated in FIG. 15 by a removable storage device 1509 and a non-removable storage device 1510.

As stated above, a number of program modules and data files may be stored in the system memory 1506. While executing on the processing unit 1504, program modules 1508 (e.g., Input/Output (I/O) manager 1524, other utility 1526 and application 1528) may perform processes including, but not limited to, one or more of the stages of the operations described throughout this disclosure, for example, the operation of verifying a meter wiring setup. Other program modules that may be used in accordance with examples of the present disclosure may include electronic mail and contacts applications, word processing applications, spreadsheet applications, database applications, slide presentation applications, drawing or computer-aided application programs, photo editing applications, authoring applications, etc.

Furthermore, examples of the present disclosure may be practiced in an electrical circuit comprising discrete electronic elements, packaged or integrated electronic chips containing logic gates, a circuit utilizing a microprocessor, or on a single chip containing electronic elements or microprocessors. For example, examples of the meter setup verification of the present disclosure may be practiced via a system-on-a-chip (SOC) where each or many of the components illustrated in FIG. 15 may be integrated onto a single integrated circuit. Such an SOC device may include one or more processing units, graphics units, communications units, system virtualization units and various application functionality all of which are integrated (or "burned") onto the chip substrate as a single integrated circuit. When operating via an SOC, the functionality described herein may be operated via application-specific logic integrated with other components of the computing device 1502 on the single integrated circuit (chip). Examples of the present disclosure may also be practiced using other technologies capable of performing logical operations such as, for example, AND, OR, and NOT, including but not limited to mechanical, optical, fluidic, and quantum technologies. In addition, examples of the present disclosure may be practiced within a general purpose computer or in any other circuits or systems.

The computing device 1502 may also have one or more input device(s) 1512 such as a keyboard, a mouse, a pen, a sound input device, a device for voice input/recognition, a touch input device, etc. The output device(s) 1514 such as a display, speakers, a printer, etc. may also be included. The aforementioned devices are examples and others may be used. The computing device 1504 may include one or more communication connections or interfaces 1516 allowing communications with other computing devices 1518 and/or meters/IEDs 1519. Examples of suitable communication connections or interfaces 1516 include, but are not limited to, a network interface card; RF transmitter, receiver, and/or transceiver circuitry; universal serial bus (USB), parallel, and/or serial ports.

The term computer readable media as used herein may include computer storage media. Computer storage media may include volatile and nonvolatile, removable and non-removable media implemented in any method or technology for storage of information, such as computer readable instructions, data structures, or program modules. The system memory 1506, the removable storage device 1509, and the non-removable storage device 1510 are all computer storage media examples (i.e., memory storage.) Computer storage media may include RAM, ROM, electrically erasable read-only memory (EEPROM), flash memory or other memory technology, CD-ROM, digital versatile disks (DVD) or other optical storage, magnetic cassettes, magnetic tape, magnetic disk storage or other magnetic storage devices, or any other article of manufacture which can be used to store information and which can be accessed by the computing device 1502. Any such computer storage media may be part of the computing device 1502. Computer storage media does not include a carrier wave or other propagated or modulated data signal.

Communication media may be embodied by computer readable instructions, data structures, program modules, or other data in a modulated data signal, such as a carrier wave or other transport mechanism, and includes any information delivery media. The term "modulated data signal" may describe a signal that has one or more characteristics set or changed in such a manner as to encode information in the signal. By way of example, and not limitation, communication media may include wired media such as a wired network or direct-wired connection, and wireless media such as acoustic, radio frequency (RF), infrared, and other wireless media.

It is to be appreciated that the computing device 1520 may, in certain embodiments, be a mobile computing device, for example, a mobile telephone, a smart phone, a personal data assistant, a tablet personal computer, a phablet, a slate, a laptop computer, and the like, with which examples of the present disclosure may be practiced.

In another embodiment, the meter/IED may perform the meter setup verification. For example, a software utility or module disposed within a meter/IED may perform a wiring check, i.e., verifies voltage and current hookups are in the correct order and that the current transformers (CT's) are not reversed based on the meter wiring configuration and the voltage and current phase angles determined by the meter. In one embodiment, the meter/IED generates a notification indicating that it is wired incorrectly. The notification may be in the form of a pop-up display or screen display on a display device coupled to the meter/IED. In one aspect, the notification is at least one of an email, text message and/or voice message that may be transmitted to an end user or technician. In another aspect, the notification may include corrective measures to rectify the incorrect wiring. For example, the corrective measures may include instructions on how to rewire the meter/IED. In a further aspect, the corrective measures may include a selectable option, presented to the user via a user interface displayed on the display device, to enable executable instructions on the meter/IED to rectify the incorrect wiring, e.g., by reassigning actual connections to the meter/IED to the proper expected value. In yet another aspect, the executable instructions are initiated by the meter/IED automatically without user intervention.

It is to be appreciated that the various features shown and described are interchangeable, that is a feature shown in one embodiment may be incorporated into another embodiment.

While non-limiting embodiments are disclosed herein, many variations are possible which remain within the concept and scope of the present disclosure. Such variations would become clear to one of ordinary skill in the art after inspection of the specification, drawings and claims herein. The present disclosure therefore is not to be restricted except within the spirit and scope of the appended claims.

Furthermore, although the foregoing text sets forth a detailed description of numerous embodiments, it should be understood that the legal scope of the present disclosure is defined by the words of the claims set forth at the end of this patent. The detailed description is to be construed as exemplary only and does not describe every possible embodiment, as describing every possible embodiment would be impractical, if not impossible. One could implement numerous alternate embodiments, using either current technology or technology developed after the filing date of this patent, which would still fall within the scope of the claims.

It should also be understood that, unless a term is expressly defined in this patent using the sentence "As used herein, the term ' ' is hereby defined to mean . . . " or a similar sentence, there is no intent to limit the meaning of that term, either expressly or by implication, beyond its plain or ordinary meaning, and such term should not be interpreted to be limited in scope based on any statement made in any section of this patent (other than the language of the claims). To the extent that any term recited in the claims at the end of this patent is referred to in this patent in a manner consistent with a single meaning, that is done for sake of clarity only so as to not confuse the reader, and it is not intended that such claim term be limited, by implication or otherwise, to that single meaning. Finally, unless a claim element is defined by reciting the word "means" and a function without the recital of any structure, it is not intended that the scope of any claim element be interpreted based on the application of 35 U.S.C. § 112, sixth paragraph.

What is claimed is:

1. A device for verifying a wire setup of an electronic power meter, the device comprising:
   a communication interface that receives a selection of a wiring setup configuration of at least one electronic power meter and at least one measured and/or calculated parameter from the at least one electronic power meter;
   at least one memory that stores the selected wiring setup configuration for the at least one electronic power meter, the at least one measured and/or calculated parameter received from the at least one electronic power meter and at least two different wiring setup configurations, each wiring setup configuration including at least two tests used to verify if the at least one electronic power meter is wired correctly; and
   at least one processor that determines selected wiring setup configuration and retrieves the at least two tests from the at least one memory based on the selected wiring setup configuration and determines if the at least one electronic power meter is wired correctly based on executing the retrieved at least two tests using the at least one measured and/or calculated parameter from the at least one electronic power meter,
   wherein the at least one processor determines the at least one electronic power meter is wired incorrectly if at least one test fails, generates a notification indicating which test has failed and generates executable instructions to reprogram the at least one electronic power meter to rectify the determined incorrect wiring based on the failed test and transmits the executable instructions to the at least one electronic power meter via the communication interface, the executable instructions reprogram the at least one electronic power meter to perform at least one of shifting at least one measured current phase by a predetermined amount and/or reassigning measured voltage values from a first voltage phase input to a second voltage phase input, and
   wherein the selected wiring setup configuration is a 3 Element Wye configuration and the retrieved at least two tests include a first test to determine if the measured voltages and currents are above a predetermined threshold, a second test to determine if any voltage phases are swapped, a third test to determine if the voltage phases are 120 degrees apart, a fourth test to determine if a current phase is 180 degrees from a corresponding voltage phase, and a fifth test to determine if a current phase is 45 degrees from a corresponding voltage phase.

2. The device as in claim 1, wherein the wiring setup configuration is one of a 3 Element Wye configuration and/or 2 CT Delta configuration.

3. The device as in claim 1, wherein the at least one measured parameter includes at least one of RMS voltage and/or RMS current.

4. The device as in claim 1, wherein the at least one calculated parameter includes at least one of voltage phase angles and/or current phase angles.

5. The device as in claim 1, wherein the notification is at least one of an email, text message and/or voice message.

6. The device as in claim 1, wherein the notification includes corrective measures to rectify the incorrect wiring based on the failed test.

7. The device as in claim 1, wherein the at least one processor determines voltage and current phase angles based on the at least one measured and/or calculated parameter from the at least one electronic power meter.

8. The device as in claim 1, wherein the transmission of the executable instructions to the at least one electronic power meter via the communication interface is without user intervention.

9. The device as in claim 1, wherein the selected wiring setup configuration is a 2 CT delta configuration and the retrieved at least two tests include a first test to determine if the measured voltages and currents are above a predetermined threshold, a second test to determine if any voltage phases are swapped, a third test to determine if a Vbc voltage phase is 60 degrees from a Vcb voltage phase, a fourth test to determine if current Ia phase is within a predetermined threshold of voltage Vab phase, a fifth test to determine if current Ic phase is within a predetermined threshold of voltage Vcb phase and a sixth test to determine if a current phase is 180 degrees from a predetermined current phase.

10. The device as in claim 1, further comprising a user interface that displays the notification relating to at least two different electronic power meters simultaneously.

11. An electronic power meter for monitoring an electrical distribution system providing power to a load, the electronic power meter comprising:
   at least one sensor coupled to the electrical distribution system, the at least one sensor configured to measure at least one parameter of the electrical distribution system and generate at least one analog signal indicative of the at least one parameter;

at least one analog-to-digital converter configured to receive the at least one analog signal and convert the at least one analog signal to at least one digital signal;

at least one memory configured to store at least one first firmware, a selection of at least two wiring setup configurations of the electronic power meter and at least one measured and/or calculated parameter of the electrical distribution system, each wiring setup configuration including at least two tests used to verify if the electronic power meter is wired correctly; and at least one processor that calculates parameters of the electrical distribution system, retrieves the at least two tests from the at least one memory based on the selected wiring setup configuration and determines if the electronic power meter is wired correctly based on executing the retrieved at least two tests using the at least one measured and/or calculated parameters, wherein the at least one processor determines the electronic power meter is wired incorrectly if at least one test fails, generates a notification indicating which test has failed and generates at least one second firmware to reprogram the electronic power meter to rectify the determined incorrect wiring based on the failed test, the at least one second firmware reprograms the at least one electronic power meter to perform at least one of shifting at least one measured current phase by a predetermined amount and/or reassigning measured voltage values from a first voltage phase input to a second voltage phase input, wherein the at least one processor executes the at least one second firmware without user intervention, and wherein the selected wiring setup configuration is a 3 Element Wye configuration and the retrieved at least two tests include a first test to determine if the measured voltages and currents are above a predetermined threshold, a second test to determine if any voltage phases are swapped, a third test to determine if the voltage phases are 120 degrees apart, a fourth test to determine if a current phase is 180 degrees from a corresponding voltage phase, and a fifth test to determine if a current phase is 45 degrees from a corresponding voltage phase.

12. The electronic power meter as in claim 11, wherein the at least one measured parameter includes at least one of RMS voltage and/or RMS current.

13. The electronic power meter as in claim 11, wherein the at least one calculated parameter includes at least one of voltage phase angles and/or current phase angles.

14. The electronic power meter as in claim 11, further comprising a display device that displays the notification.

15. The electronic power meter as in claim 11, further comprising a communication interface that transmits the notification to an external device, wherein the notification is at least one of an email, text message and/or voice message.

16. The electronic power meter as in claim 11, wherein the notification includes corrective measures to rectify the incorrect wiring based on the failed test.

17. The electronic power meter as in claim 11, wherein the at least one processor determines voltage and current phase angles based on the at least one measured and/or calculated parameter.

18. An electronic power meter for monitoring an electrical distribution system providing power to a load, the electronic power meter comprising:

a housing;

at least one sensor disposed in the housing and coupled to the electrical distribution system, the at least one sensor configured to measure at least one parameter of the electrical distribution system and generate at least one analog signal indicative of the at least one parameter;

at least one analog-to-digital converter disposed in the housing and configured to receive the at least one analog signal and convert the at least one analog signal to at least one digital signal;

at least one memory disposed in the housing and configured to store at least one first firmware, a selection of at least two wiring setup configurations of the electronic power meter and at least one measured and/or calculated parameter of the electrical distribution system, each wiring setup configuration including at least two tests used to verify if the electronic power meter is wired correctly;

at least one processor disposed in the housing that calculates parameters of the electrical distribution system, retrieves the at least two tests from the at least one memory based on the selected wiring setup configuration and determines if the electronic power meter is wired correctly based on executing the retrieved at least two tests using the at least one measured and/or calculated parameters; and a user interface including a display device disposed in a surface of the housing, wherein the at least one processor determines the electronic power meter is wired incorrectly if at least one test fails, generates a notification indicating which test has failed to be displayed on the display device and generates at least one second firmware to reprogram the electronic power meter to rectify the determined incorrect wiring based on the failed test, the at least one second firmware reprograms the at least one electronic power meter to perform at least one of the shifting at least one measured current phase by a predetermined amount and/or reassigning measured voltage values from a first voltage phase input to a second voltage phase input, wherein, if the at least one processor determines that the at least one electronic power meter is wired incorrectly, the at least one processor prompts a user via the display device of the user interface to initiate corrective measures; and if the user activates the corrective measures via the user interface, the at least one processor executes the at least one second firmware.

* * * * *